US011393908B1

United States Patent
Suresha et al.

(10) Patent No.: US 11,393,908 B1
(45) Date of Patent: Jul. 19, 2022

(54) METHODS OF FORMING A MICROELECTRONIC DEVICE, AND RELATED MICROELECTRONIC DEVICES, MEMORY DEVICES, AND ELECTRONIC SYSTEMS

(71) Applicant: Micron Technology, Inc., Boise, ID (US)

(72) Inventors: Sandeep Ramasamudra Suresha, Boise, ID (US); Terrence B. McDaniel, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/167,853

(22) Filed: Feb. 4, 2021

(51) Int. Cl.
*H01L 29/417* (2006.01)
*H01L 29/45* (2006.01)
*H01L 21/283* (2006.01)
*H01L 27/108* (2006.01)
*H01L 29/78* (2006.01)
*H01L 29/40* (2006.01)

(52) U.S. Cl.
CPC ...... *H01L 29/41741* (2013.01); *H01L 21/283* (2013.01); *H01L 27/10805* (2013.01); *H01L 29/401* (2013.01); *H01L 29/45* (2013.01); *H01L 29/7827* (2013.01); *H01L 29/41766* (2013.01)

(58) Field of Classification Search
CPC ......... H01L 29/41766; H01L 29/41741; H01L 29/7827; H01L 27/10876; H01L 27/10864; H01L 27/10805; H01L 21/283
See application file for complete search history.

(56) References Cited

U.S. PATENT DOCUMENTS

| 8,350,324 B2* | 1/2013 | Hino | H01L 29/66734 257/330 |
| 2010/0171173 A1* | 7/2010 | Hsieh | H01L 29/7813 257/333 |
| 2010/0200912 A1* | 8/2010 | Hsieh | H01L 29/66727 257/329 |
| 2011/0278663 A1* | 11/2011 | Hino | H01L 29/7811 257/330 |
| 2018/0090583 A1* | 3/2018 | Choi | H01L 21/823821 |

(Continued)

FOREIGN PATENT DOCUMENTS

| CN | 104835845 B | * 12/2018 | ......... H01L 29/1054 |
| KR | 20140114480 A | * 9/2014 | ....... C23C 16/45529 |

*Primary Examiner* — Joseph C. Nicely
(74) *Attorney, Agent, or Firm* — TraskBritt

(57) ABSTRACT

A microelectronic device comprises a conductive structure, a metal nitride material, and a metal silicide material. The conductive structure comprises a first portion having a first width, and a second portion under the first portion and extending into a semiconductive material. The second portion has a tapered profile defining additional widths varying from the first width at an upper boundary of the second portion to a second width less than the first width at a lower boundary of the second portion. The metal nitride material substantially surrounds outer surfaces of the first portion and the second portion of the conductive structure. The metal silicide material substantially covers outer surfaces of the metal nitride material within vertical boundaries of the second portion of the conductive structure. Related methods, memory devices, and electronic systems are also described.

23 Claims, 11 Drawing Sheets

(56) References Cited

U.S. PATENT DOCUMENTS

| | | | |
|---|---|---|---|
| 2019/0206449 A1* | 7/2019 | Beigel | G11C 5/025 |
| 2020/0111919 A1* | 4/2020 | Karda | H01L 29/78618 |
| 2020/0381551 A1* | 12/2020 | Nagakura | H01L 29/7802 |
| 2021/0098583 A1* | 4/2021 | Tsai | H01L 29/401 |
| 2021/0193663 A1* | 6/2021 | Sharma | H01L 45/085 |
| 2021/0280686 A1* | 9/2021 | Amano | H01L 29/45 |

* cited by examiner

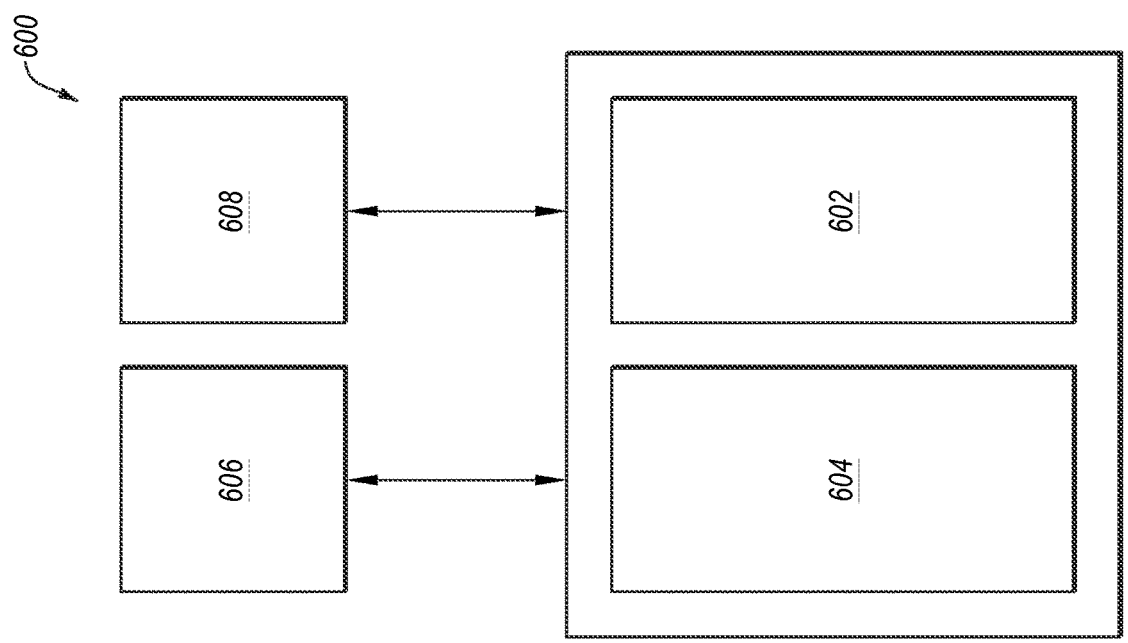

METHODS OF FORMING A MICROELECTRONIC DEVICE, AND RELATED MICROELECTRONIC DEVICES, MEMORY DEVICES, AND ELECTRONIC SYSTEMS

TECHNICAL FIELD

Embodiments of the disclosure relate to the field of semiconductor device design and fabrication. More specifically, embodiments of the disclosure relate to methods of forming a microelectronic device, and to related microelectronic device, memory devices, and electronic systems.

BACKGROUND

Microelectronic device designers often desire to increase the level of integration or density of features within a microelectronic device by reducing the dimensions of the individual features and by reducing the separation distance between neighboring features. In addition, microelectronic device designers often seek to design architectures that are not only compact, but offer performance advantages, as well as simplified designs.

One example of a semiconductor device is a memory device. Memory devices are generally provided as internal integrated circuits in computers or other electronic devices. There are many species of memory including, but not limited to, random-access memory (RAM), read-only memory (ROM), dynamic random access memory (DRAM), synchronous dynamic random access memory (SDRAM), ferroelectric random access memory (FeRAM), FLASH memory, and resistance variable memory. Non-limiting examples of resistance variable memory include resistive random access memory (ReRAM), conductive bridge random access memory (conductive bridge RAM), magnetic random access memory (MRAM), phase change material (PCM) memory, phase change random access memory (PCRAM), spin-torque-transfer random access memory (STTRAM), oxygen vacancy-based memory, and programmable conductor memory.

A typical memory cell of a memory device includes an access device e.g., a transistor) and a memory storage structure (e.g., a capacitor). The access device generally includes a channel region between a pair of source/drain regions, and a gate configured to electrically connect the source/drain regions to one another through the channel region. The access devices can comprise planar access devices or vertical access devices. Planar access devices can be distinguished from vertical access devices based upon the direction of current flow between the source and drain regions thereof. Current flow between the source and drain regions of a vertical access device is primarily substantially orthogonal (e.g., perpendicular) to a primary (e.g., major) surface of a substrate or base structure thereunder, and current flow between source and drain regions of a planar access device is primarily parallel to the primary surface of the substrate or base thereunder.

Conventional methods of forming memory cells for memory devices can negatively impact desirable electrical properties of the memory cells and the memory devices. For example, a conductive contact included in conventional memory cell may employ a metal silicide (e.g., cobalt disilicide ($CoSi_2$)) to decrease contact resistance, as well as a metal nitride (e.g., titanium nitride (TiN)) liner to facilitate adhesion of a conductive structure (e.g., a conductive plug) to the metal silicide. However, it can be difficult to form metal silicide to a substantially uniform thickness at relatively small contact diameters (e.g., diameters less than or equal to about 10 nanometers (nm)), resulting in metal silicide detachment problems (e.g., due to void creation in the metal silicide) and/or undesirable leakage currents (e.g., due to undesirable metal silicide growth into a silicon-containing region of the memory cell, such as a source/drain region of an access device thereof). Metal silicide oxidation can also undesirably increase contact resistance, requiring complex cleaning strategies (especially at relatively small contact diameters). Conventional methods of forming the metal nitride liner can also undesirability limit the size of the conductive structure subsequently formed thereover, which may undesirably increase contact resistance and/or may require complex alignment processes to connect other structures to the conductive structure.

BRIEF DESCRIPTION OF THE SEVERAL VIEWS OF THE DRAWINGS

FIG. 6 is a schematic block diagram of an electronic system, in accordance with embodiments of the disclosure.

DETAILED DESCRIPTION

Figure 1A:
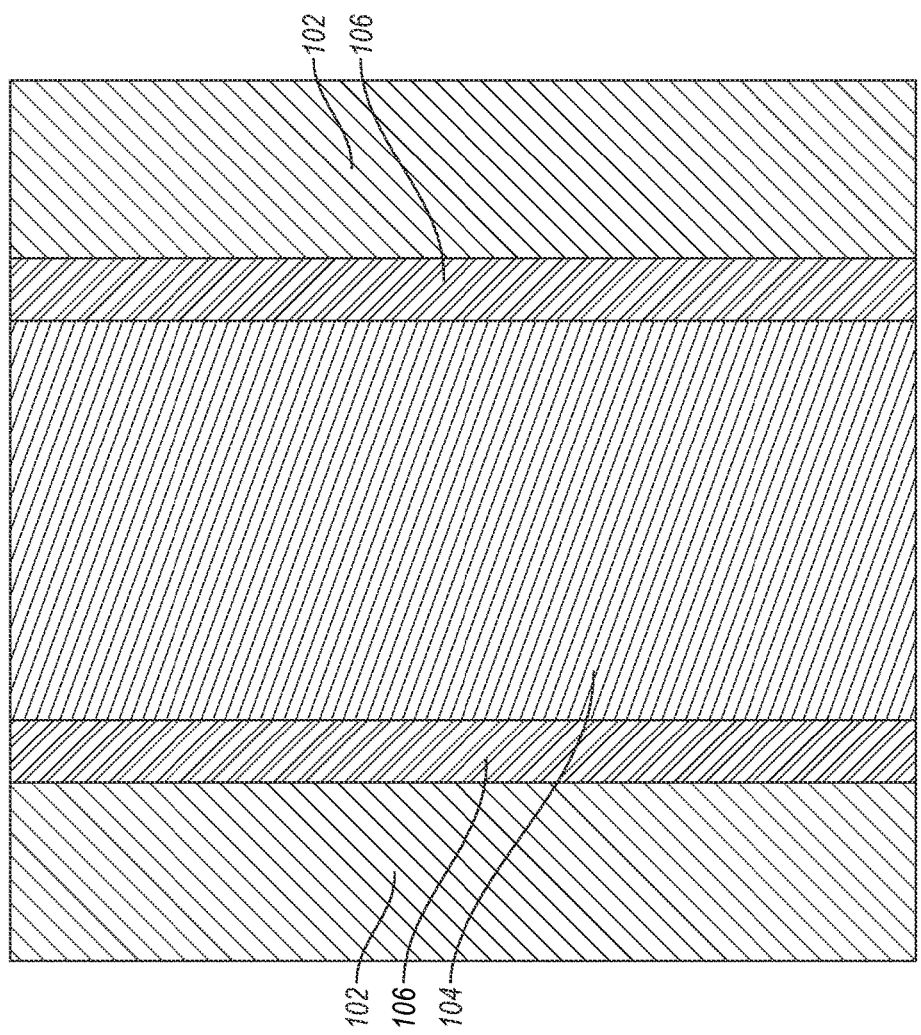
FIGS. 1A through 1F are simplified, partial cross-sectional views illustrating a microelectronic device structure at different processing stages of a method of forming a microelectronic device, in accordance with embodiments of the disclosure.

The following description provides specific details, such as material types, material thicknesses, and processing conditions in order to provide a thorough description of embodiments of the disclosure. However, a person of ordinary skill in the art will understand that the embodiments of the disclosure may be practiced without employing these specific details. Indeed, the embodiments of the disclosure may be practiced in conjunction with conventional fabrication techniques employed in the industry. In addition, the description provided below does not form a complete process flows for manufacturing a microelectronic device or electronic system. The structures described below do not form a complete microelectronic device or electronic system. Only those process acts and structures necessary to understand the embodiments of the disclosure are described in detail below. Additional acts to form a complete microelectronic device or electronic system from the structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, a "memory device" means and includes microelectronic devices exhibiting memory functionality, but not necessary limited to memory functionality. Stated another way, and by way of non-limiting example only, the term "memory device" includes not only conventional memory (e.g., conventional volatile memory, such as conventional dynamic random access memory (DRAM); conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

As used herein, the term "configured" refers to a size, shape, material composition, material distribution, orientation, and arrangement of one or more of at least one structure and at least one apparatus facilitating operation of one or more of the structure and the apparatus in a predetermined way.

As used herein, the phrase "coupled to" refers to structures operatively connected with each other, such as electrically connected through a direct Ohmic connection or through an indirect connection (e.g., by way of another structure).

As used herein, the singular forms "a," "an," and "the" are intended to include the plural forms as well, unless the context clearly indicates otherwise.

As used herein, "and/or" includes any and all combinations of one or more of the associated listed items.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. With reference to the figures, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, reference to a feature as being "over" an additional feature means and includes the feature being directly on top of, adjacent to (e.g., horizontally adjacent to, vertically adjacent to), underneath, or in direct contact with the additional feature. It also includes the element being indirectly on top of, adjacent to (e.g., horizontally adjacent to, vertically adjacent to), underneath, or near the additional feature, with one or more other features located therebetween. In contrast, when an element is referred to as being "on" or another element, there are no intervening features therebetween.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, features (e.g., regions, materials, structures, devices) described as "neighboring" one another means and includes features of the disclosed identity (or identities) that are located most proximate (e.g., closest to) one another. Additional features (e.g., additional regions, additional materials, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

Unless the context indicates otherwise, the materials described herein may be formed by any suitable process including, but not limited to, spin coating, blanket coating, chemical vapor deposition ("CVD"), atomic layer deposition ("ALD"), plasma enhanced ALD, physical vapor deposition ("PVD") (including sputtering, evaporation, ionized PVD, and/or plasma-enhanced CVD (PECVD)), or epitaxial growth. Alternatively, the materials may be grown in situ. Depending on the specific material to be formed, the technique for depositing or growing the material may be selected by a person of ordinary skill in the art. In addition, unless the context indicates otherwise, the removal of materials described herein may be accomplished by any suitable process including, but not limited to, etching (e.g., dry etching, wet etching, vapor etching), ion milling, abrasive planarization (e.g., chemical-mechanical planarization ("CMP")), and/or other known methods.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pa), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively doped semiconductor material (e.g., conductively-doped polysilicon, conductively-doped germanium (Ge), conductively-doped silicon germanium (SiGe)). In addition, a "conductive structure" means and includes a structure formed of and including conductive material.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide (AlOx), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x", "y", and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x", "y", and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including insulative material.

Thus, according to embodiments described herein, a microelectronic device comprises a conductive structure, a metal nitride material, and a metal silicide material. The conductive structure comprises a first portion having a first width, and a second portion under the first portion and extending into a semiconductive material. The second portion has a tapered profile defining additional widths varying from the first width at an upper boundary of the second portion to a second width less than the first width at a lower boundary of the second portion. The metal nitride material substantially surrounds outer surfaces of the first portion and the second portion of the conductive structure. The metal silicide material substantially covers outer surfaces of the metal nitride material within vertical boundaries of the second portion of the conductive structure.

FIGS. 1A through 1F are simplified, partial cross-sectional views illustrating a microelectronic device structure at different processing stages of a method of forming a microelectronic device (e.g., a memory device, such as a DRAM device), in accordance with embodiments of the disclosure. With the description provided below, it will be readily apparent to one of ordinary skill in the art that the methods described herein may be used in fabrication of various devices. In other words, the methods of the disclosure may be used whenever it is desired to form a microelectronic device.

Referring to FIG. 1A, a microelectronic device structure 100 may include an isolation material 102, a semiconductive material 104 vertically extending (e.g., in the Z-direction) through the isolation material 102, and, optionally, a dielectric liner material 106 horizontally interposed between the semiconductive material 104 and the isolation material 102. As shown in FIG. 1A, the upper surfaces of the isolation material 102, the semiconductive material 104, and the dielectric liner material 106 may be formed to be substantially coplanar with one another.

The isolation material 102 may be formed of and include at least one insulative material, such as one or more of a dielectric oxide material (e.g., $SiO_x$) and a dielectric nitride material (e.g., $SiN_y$). In some embodiments, the isolation material 102 is formed of and includes $SiO_2$. In additional embodiments, the isolation material 102 is formed of and includes $Si_3N_4$.

The dielectric liner material 106, if formed, may be formed of and include at least one dielectric material (e.g., at least one dielectric oxide material), such as one or more of silicon oxide (e.g., $SiO_2$), phosphosilicate glass, borosilicate glass, borophosphosilicate glass, fluorosilicate glass, aluminum oxide, and a high-k oxide (e.g., hafnium oxide ($HfO_x$), niobium oxide ($NbO_x$), titanium oxide ($TiO_x$)). In some embodiments, the dielectric liner material 106 is formed of and includes $SiO_2$.

The dimensions of dielectric liner material 106 may be selected to provide desired dimensions and spacing to the semiconductive material 104 and to additional features (e.g., structures, materials, devices) of the microelectronic device structure 100 to subsequently be formed (as described in further detail below). By way of non-limiting example, a width of the dielectric liner material 106 in the X-direction may be less than or equal to about 15 nm, such as less than or equal to about 10 nm, less than or equal to about 5 nm, less than or equal to about 3 nm, or less than or equal to about 1.5 nm. In some embodiments, the width of the dielectric liner material 106 is less than or equal to about 3 nm. In additional embodiments, the dielectric material 106 is not formed (e.g., is omitted), such that semiconductive material 104 is formed directly horizontally adjacent the isolation material 102.

The semiconductive material 104 may be formed of and include one or more of polycrystalline, germanium (Ge), silicon germanium (SiGe), and at least one oxide semiconductive material. In some embodiments, the semiconductive material 104 is formed of and includes polycrystalline silicon. In additional embodiments, the semiconductive material 104 is formed of and includes an oxide semiconductor material. The oxide semiconductive material may, for example, include one or more (e.g., one, two or more, three or more) of zinc tin oxide ($Zn_xSn_yO$, commonly referred to as "ZTO"), indium zinc oxide ($In_xZn_yO$, commonly referred to as "IZO"), zinc oxide ($Zn_xO$), indium gallium zinc oxide ($In_xGa_yZn_zO$, commonly referred to as "IGZO"), indium gallium silicon oxide ($In_xGa_ySi_zO$, commonly referred to as "IGSO"), indium tungsten oxide ($In_xW_yO$, commonly referred to as "IWO"), indium oxide ($In_xO$), tin oxide ($Sn_xO$), titanium oxide (TiO), zinc oxide nitride ($Zn_xON_z$), magnesium zinc oxide ($Mg_xZn_yO$), zirconium indium zinc oxide ($Zr_xIn_yZn_zO$), hafnium indium zinc oxide ($Hf_x$-$In_yZn_zO$), tin indium zinc oxide ($Sn_xIn_yZn_zO$), aluminum tin indium zinc oxide ($Al_xSn_yIn_zZn_aO$), silicon indium zinc oxide ($Si_xIn_yZn_zO$), aluminum zinc tin oxide ($Al_xZn_ySn_zO$), gallium zinc tin oxide ($Ga_xZn_ySn_zO$), zirconium zinc tin oxide ($Zr_xZn_ySn_zO$), and other similar materials. The semiconductive material 104 may be selectively etchable relative to the isolation material 102 and the dielectric liner material 106 during common (e.g., collective, mutual) exposure to a pre-determined etchant. As used herein, a material is "selectively etchable" relative to another material if the material exhibits an etch rate that is at least about five times (5×) greater than the etch rate of another material, such as about ten times (10×) greater, about twenty times (20×) greater, or about forty times (40×) greater. In some embodiments, the semiconductive material 104 is employed as a channel material for a transistor (e.g., a vertical transistor), as described in further detail below.

Figure 1B:
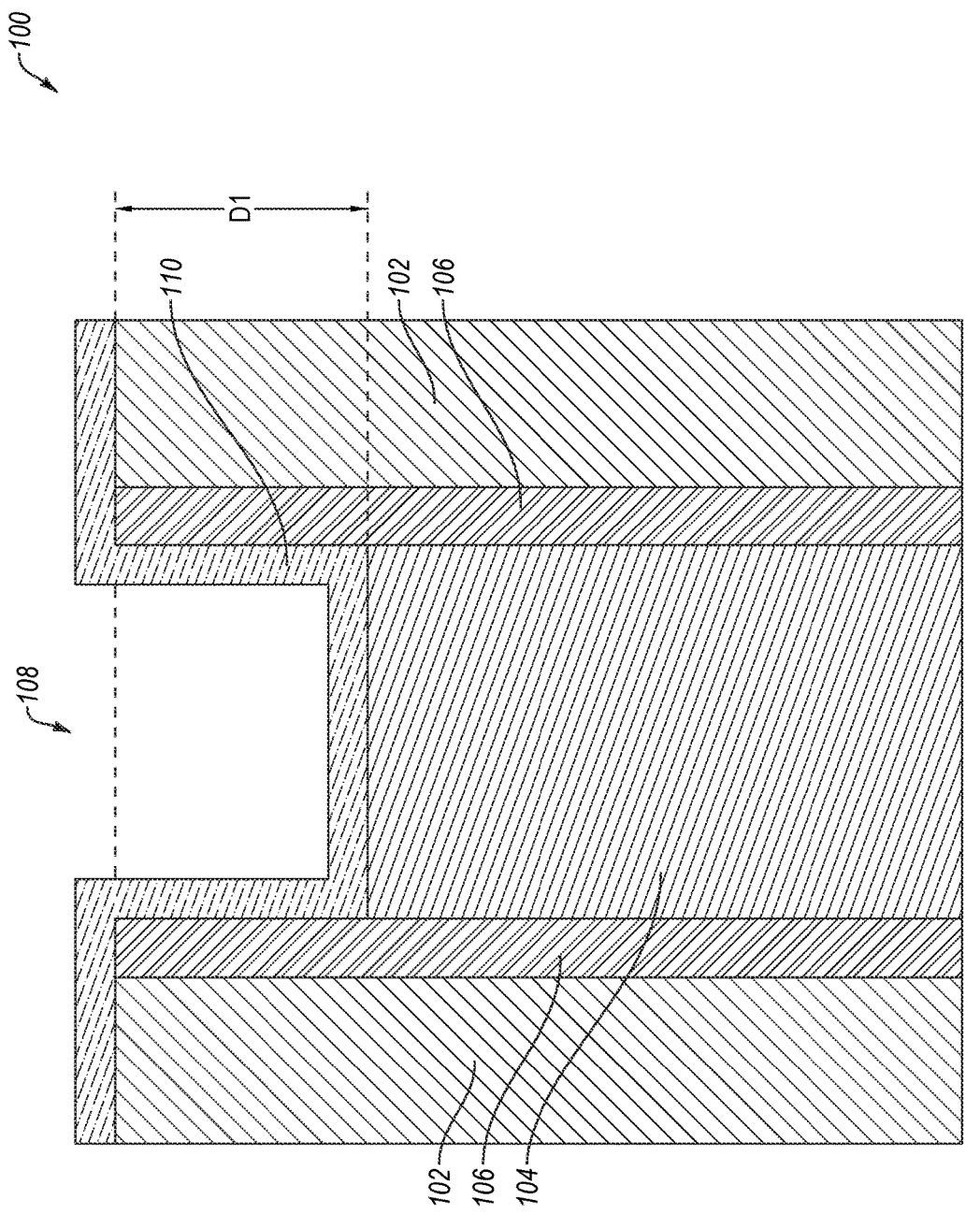

Referring next to FIG. 1B, the microelectronic device structure 100 may be subjected to a first material removal process (e.g., an etching process) to vertically recess the semiconductive material 104 relative to the isolation material 102 and the dielectric liner material 106 and form an initial opening 108, and a dielectric material 110 may be formed on surfaces of the microelectronic device structure 100 inside and outside of the initial opening 108. The initial opening 108 may vertically extend (e.g., in the Z-direction) a first depth D1 into the isolation material 102 from an uppermost surface of the isolation material 102. By way of non-limiting example, the first depth D1 of the initial opening 108 may be less than or equal to about 40 nm, such as from about 10 nm to about 35 nm, from about 18 nm to about 25 nm, or from about 28 nm to about 32 nm. The first material removal process may selectively remove an upper portion of the semiconductive material 104 while leaving the isolation material 102 and the dielectric liner material 106 substantially intact (e.g., unremoved, unetched). In addition, the initial opening 108 may have a substantially uniform horizontal dimensions (e.g., in the X-direction, in the Y-direction).

Still referring to FIG. 1B, the dielectric material 110 may be formed (e.g., conformally formed) on or over exposed surfaces of the semiconductive material 104 and the dielectric liner material 106 defining the initial opening 108, as well as surfaces of the dielectric liner material 106 and the isolation material 102 outside of boundaries of the initial opening 108. For example, the dielectric material 110 may be formed substantially continuously across an upper surface of a remaining portions of the semiconductive material 104, inner sider surfaces of the dielectric liner material 106, and upper surfaces of the dielectric liner material 106 and the isolation material 102.

The dielectric material 110 may be formed of and include at least one dielectric material, such as one or more of a dielectric oxide material (e.g., a silicon oxide ($SiO_x$), such as silicon dioxide ($SiO_2$); phosphosilicate glass; borosilicate glass; borophosphosilicate glass; fluorosilicate glass; aluminum oxide; high-k oxides, such as hafnium oxide ($HfO_x$); a combination thereof). In some embodiments, the dielectric material 110 is formed of and includes $SiO_2$.

The dielectric material 110 may be formed using conventional processes and conventional processing equipment, which are not described in detail herein. By way of non-limiting example, the dielectric material 110 may be conformally formed (e.g., deposited) on or over exposed surfaces of the semiconductive material 104, the dielectric liner material 106, and the isolation material 102 using one or more of an ALD process and an in situ growth process. In some embodiments, the dielectric material 110 is formed through an in situ growth process.

Figure 1C:
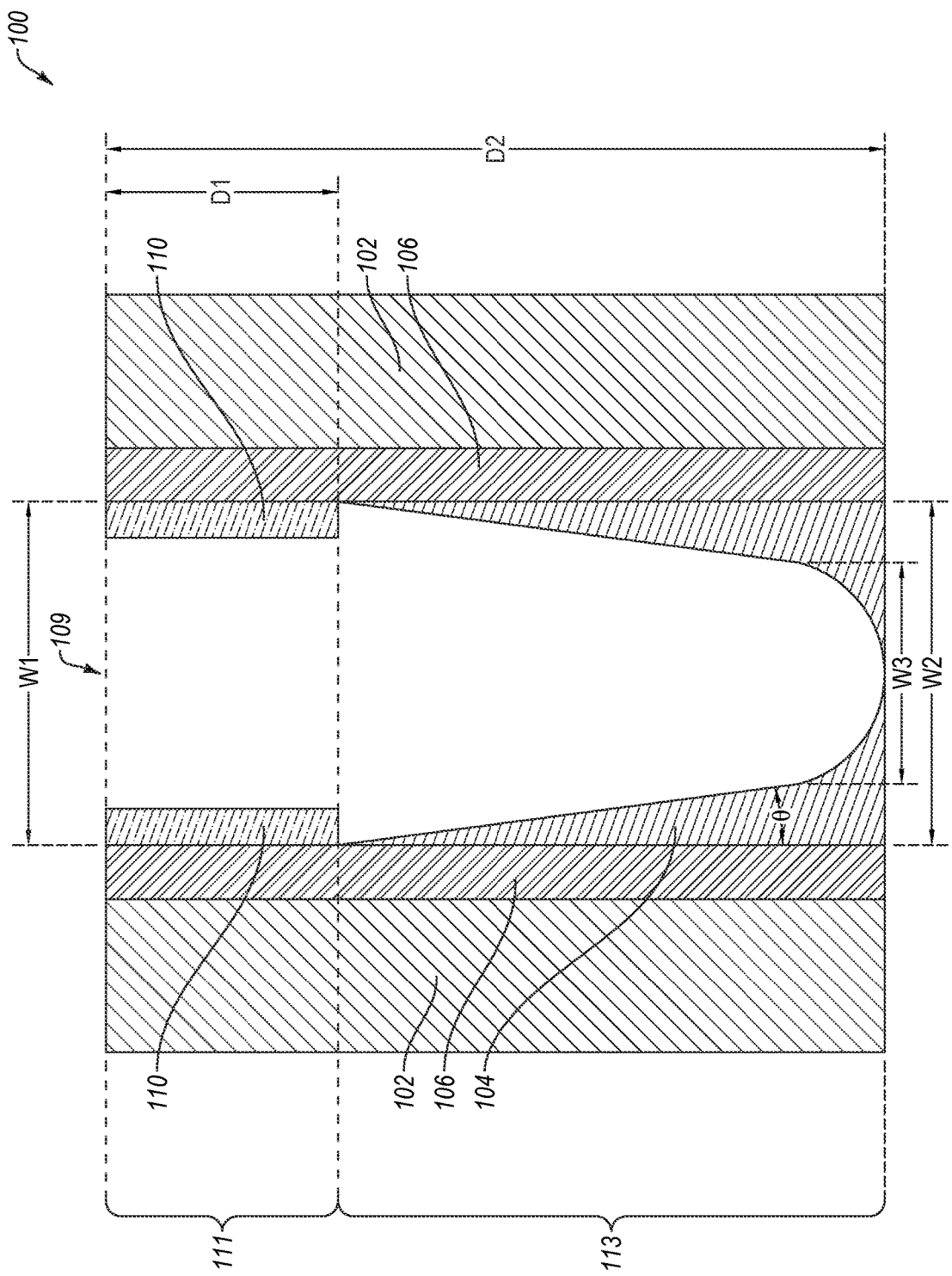

Referring next to FIG. 1C, the microelectronic device structure 100 may be subjected to at least one second material removal process (e.g., another etching process) to remove portions of the dielectric material 110 and the additional portions of the semiconductive material 104. As shown in FIG. 1C, the second material removal process vertically extends the initial opening 108 (FIG. 1B) to form an opening 109 vertically extending to a second depth D2 within the isolation material 102 greater than the first depth D1 of the initial opening 108. As non-limiting example, the second depth D2 may be within a range of from about 40 nm to about 60 nm, such as from about 45 nm to about 55 nm, or from about 52 nm to about 54 nm. The second material removal process may remove portions of the dielectric material 110 from horizontally extending surfaces of the isolation material 102, the dielectric liner material 106, and the semiconductive material 104, while leaving (e.g., maintaining) additional portions of the dielectric material 110 on exposed vertically extending surfaces (e.g., inner sidewalls) dielectric liner material 106. The second material removal process may form the opening 109 to have a tapered profile within the semiconductive material 104, as described in further detail below.

Continuing reference to FIG. 1C, the opening 109 may include a first portion 111 (e.g., upper portion) extending to the first depth D1, and a second portion 113 (e.g., lower portion) extending from a lower boundary of the first portion 111 to the second depth D2. The first portion 111 may have first horizontal dimensions (e.g., in the X-direction, in the Y-direction) that are substantially uniform throughout a vertical height (e.g., the first depth D1) of the first portion 111. In some embodiments, the first portion 111 has a first width W1 (e.g., a diameter) that is substantially uniform throughout a vertical height of the first portion 111. The second portion 113 may have a tapered profile defining additional horizontal dimensions (e.g., in the X-direction, in the Y-direction) that vary in throughout a vertical height (e.g., the second depth D2 minus the first depth D1) of the second portion 113. In some embodiments, the second portion 113 has a tapered profile defining additional widths (e.g., diameters) that vary throughout a vertical height of the second portion 113. As non-limiting examples, the first width W1 of the first portion 111 may be from about 18 nm to about 34 nm, such as from about 20 nm to about 28 nm, or about 22 nm.

As shown in FIG. 1C, the second portion 113 of the opening 109 may include a second width W2 (e.g., a second diameter) at an uppermost vertical boundary of the second portion 113 that is relatively larger than a third width W3 (e.g., a second diameter) proximate a lowermost vertical boundary of the second portion 113. The width (e.g., diameter) of the second portion 113 of the opening 109 may progressively decrease in a downward vertical direction (e.g., negative Z-direction) from the relatively larger second width W2 at the uppermost vertical boundary to the relatively smaller third width W3 at the lowermost vertical boundary. As non-limiting examples, the second width W2 at the uppermost vertical boundary of the second portion 113 may be from about 15 nm to about 30 nm, such as from about 18 nm to about 24 nm, or about 22 nm. The third width W3 proximate the lowermost vertical boundary of the second portion 113 may be from about 10 nm to about 24 nm, such as from about 12 nm to about 20 nm, or about 14 nm.

In some embodiments, the semiconductive material 104 vertically substantially horizontally surrounds the second portion 113 of the opening 109 across an entire vertical height of the second portion 113 of the opening 109. The semiconductive material 104 may substantially circumscribe the second portion 113 proximate (e.g., at) the uppermost vertical boundary of the second portion 113. As shown in FIG. 1C, in some embodiments, the second width W2 of the second portion 113 is substantially the same as (e.g., equal to) the first width W1 of the first portion 111 at a lowermost vertical boundary thereof. Accordingly, an undercut region of the opening 109 may be formed at the interface of the uppermost vertical boundary of second portion 113 of the opening 109 and the lowermost vertical boundary of the remaining portions of the dielectric material 110. In additional embodiments, the second width W2 of the second portion 113 is smaller than the first width W1 of the first portion 111 at a lowermost vertical boundary thereof. In other words, the first width W1 of the first portion 111 is substantially the same as the sum of the second width W2 of the second portion and the thickness of remaining portions of the dielectric material 110. Accordingly, the opening 109 may be free of an undercut region at the interface of the uppermost vertical boundary of the second portion 113 and the lowermost vertical boundary of the remaining portions of the dielectric material 110.

Still referring to FIG. 1C, a difference between the second width W2 of the second portion 113 of the opening 109 proximate the uppermost vertical boundary of the second portion 113 and the third width W3 of the second portion 113 proximate the lowermost vertical boundary of the second portion 113 is a function of a taper angle θ of the second portion 113. The taper angle θ may be taken relative to a direction (e.g., Z-direction) extending perpendicular to the uppermost vertical boundary of the second portion 113. By way of non-limiting example, the taper angle θ may be within a range from about 0 degrees (°) to about 20°, such as from about 5° to about 15°, from about 5° to about 10°, or from about 7° to about 10°. A vertically lower end of the second portion 113 of the opening 109 may be substantially planar (e.g., flat) or may be at least partially (e.g., substantially) non-planar (e.g., arcuate, rounded). In some embodiments, the vertically lower end of the second portion 113 has an arcuate geometry.

Figure 1D:
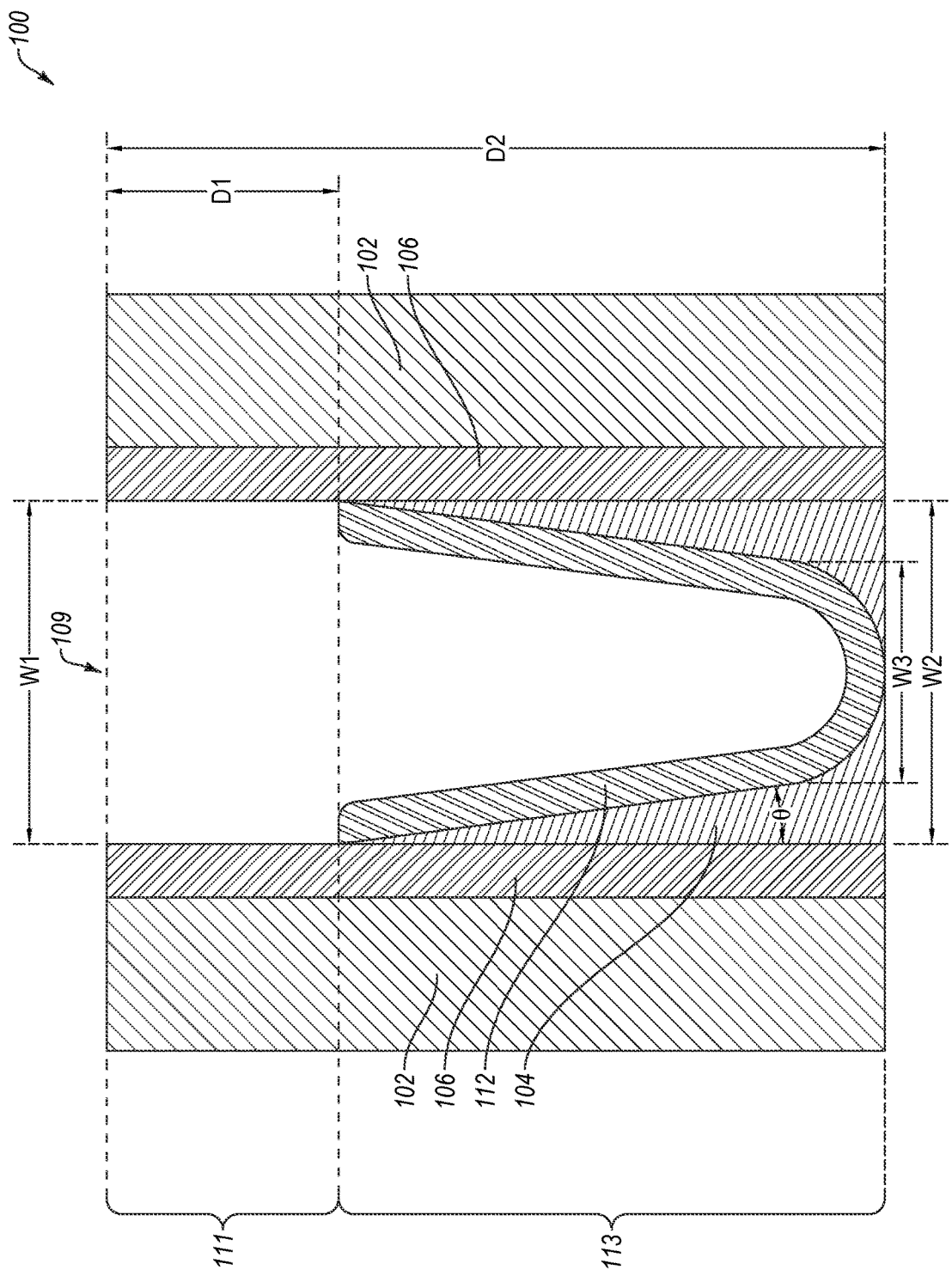

Referring now to FIG. 1D, remaining portions of the dielectric material 110 (FIG. 1C) may be selectively removed to expose vertically extending surfaces (e.g., inner side surfaces) of the dielectric liner material 106. In addition, a metal silicide material 112 may be formed on, over, and/or within portions of the semiconductive material 104 exposed by the opening 109. As shown in FIG. 1D, exposed portions of the dielectric liner material 106 within the opening 109 may be substantially free of the metal silicide material 112 thereon (e.g., directly horizontally adjacent thereto). The metal silicide material 112 may substantially cover portions of the semiconductive material 104 exposed by the second portion 113 of the opening 109. The metal silicide material 112 may extend to the uppermost vertical boundary of the second portion 113 of the opening 109. The first portion 111 of the opening may be substantially free of the metal silicide material 112. The metal silicide material 112 may partially (e.g., less than completely) fill the opening 109. In some embodiments, exterior surfaces of the metal silicide material 112 are substantially surrounded by the semiconductive material 104.

As shown in FIG. 1D, when viewed from the X-Z plane, the metal silicide material 112 may be formed to exhibit a parabolic shape (e.g., a U-shape) within the second portion 113 of the opening 109. In some embodiments, the metal silicide material 112 may be formed to exhibit a parabolic shape in a longitudinal cross-sectional plane (e.g., the X-Z plane). The configuration of the metal silicide material 112 may increase a surface area of the metal silicide material 112 by about 5 or 6 times compared to conventional metal silicide material configuration, and may thus reduce contact resistance of a fully formed contact structure, as described in further detail below with reference to FIG. 1F.

The metal silicide material 112 may be formed to exhibit a substantially uniform thickness. For example, the metal silicide material 112 may be formed to exhibit a thickness less than or equal to about 30 nm, such as less than or equal to about 15 nm, less than or equal to about 10, or less than or equal to about 5 nm. In some embodiments, the thickness of the metal silicide material 112 is within a range of from about 1.5 nm to about 12 nm, such as within a range of from about 5 nm to about 9 nm. In further embodiments, the thickness of the metal silicide material 112 is about 8 nm.

The metal silicide material 112 may be formed of and include at least one metal silicide. By way of non-limiting example, the metal silicide material 112 may be formed of and include one or more of titanium silicide ($TiSi_x$), cobalt silicide ($CoSi_x$), tungsten silicide ($WSi_x$), tantalum silicide ($TaSi_x$), molybdenum silicide ($MoSi_x$), and nickel silicide ($NiSi_x$). In some embodiments, the metal silicide material 112 comprises $CoSi_x$ (e.g., $CoSi_2$). In additional embodiments, the metal silicide material 112 comprises $TiSi_x$ (e.g., $TiSi_2$).

The metal silicide material 112 may be substantially homogeneous or may be heterogeneous. In some embodiments, the metal silicide material 112 is substantially homogeneous, such that the metal silicide material 112 exhibits a substantially uniform (e.g., even, non-variable) distribution of the elements thereof. For example, amounts (e.g., atomic concentrations) of each element (e.g., one or more metals, Si) included in the metal silicide material 112 may not vary throughout the dimensions (e.g., horizontal dimensions, vertical dimensions) of the metal silicide material 112. In additional embodiments, the metal silicide material 112 is substantially heterogeneous, such that the metal silicide material 112 exhibits a substantially non-uniform (e.g., non-even, variable) distribution of one or more of the elements thereof. For example, amounts (e.g., atomic concentrations) of one or more elements (e.g., one or more metals, Si) included in the metal silicide material 112 may vary throughout dimensions of the metal silicide material 112. Amounts of the one or more elements may vary stepwise (e.g., change abruptly), or may vary continuously (e.g., change progressively, such as linearly, parabolically) throughout different portions of the metal silicide material 112.

The metal silicide material 112 may be formed using one or more conformal deposition processes, such as one or more of a conformal CVD process and an ALD process. As a non-limiting example, the metal silicide material 112 may be formed using an ALD process. In some embodiments, the ALD process includes exposing the semiconductive material 104 of the at least one metal-containing precursor to form an adsorbed metal-containing material on or over surfaces of the semiconductive material 104. At least one ligand of the metal-containing precursor may promote or facilitate chemisorption of the metal-containing precursor to uncoordinated sites at the surfaces the semiconductive material 104. As used herein, the terms "chemisorb" and "chemisorption" mean and include a mechanism wherein at least one precursor is adsorbed or bound to at least one surface of a material by way of chemical bonding, such as one or more of covalent bonding and ionic bonding. Thereafter, the adsorbed metal-containing material may be exposed to at least one reactant to form a thin film of metal of the adsorbed metal-containing material. In some embodiments, the reactant comprises a silicon-containing reactant that react with the adsorbed metal-containing material and deposits a silicon material. The silicon-containing reactant may, for example, remove at least one ligand of the adsorbed metal-containing material to form the thin film of metal as well as a thin film of silicon vertically adjacent the thin film of metal. The microelectronic device structure 100 may then be subjected to at least one annealing process to enhance or facilitate material (e.g., metal) diffusion between thin film of metal and the silicon material (e.g., thin film of silicon) and form the metal silicide material 112. In additional embodiments, the reactant does not include silicon. The reactant may, for example, be formulated to react with the adsorbed metal-containing material to remove at least one ligand of the adsorbed metal-containing material and form a thin film of metal. The microelectronic device structure 100 may then be subjected to at least one annealing process to enhance or facilitate material (e.g., metal) diffusion between the thin film of metal and the semiconductive material 104 to form the metal silicide material 112.

Figure 1E:
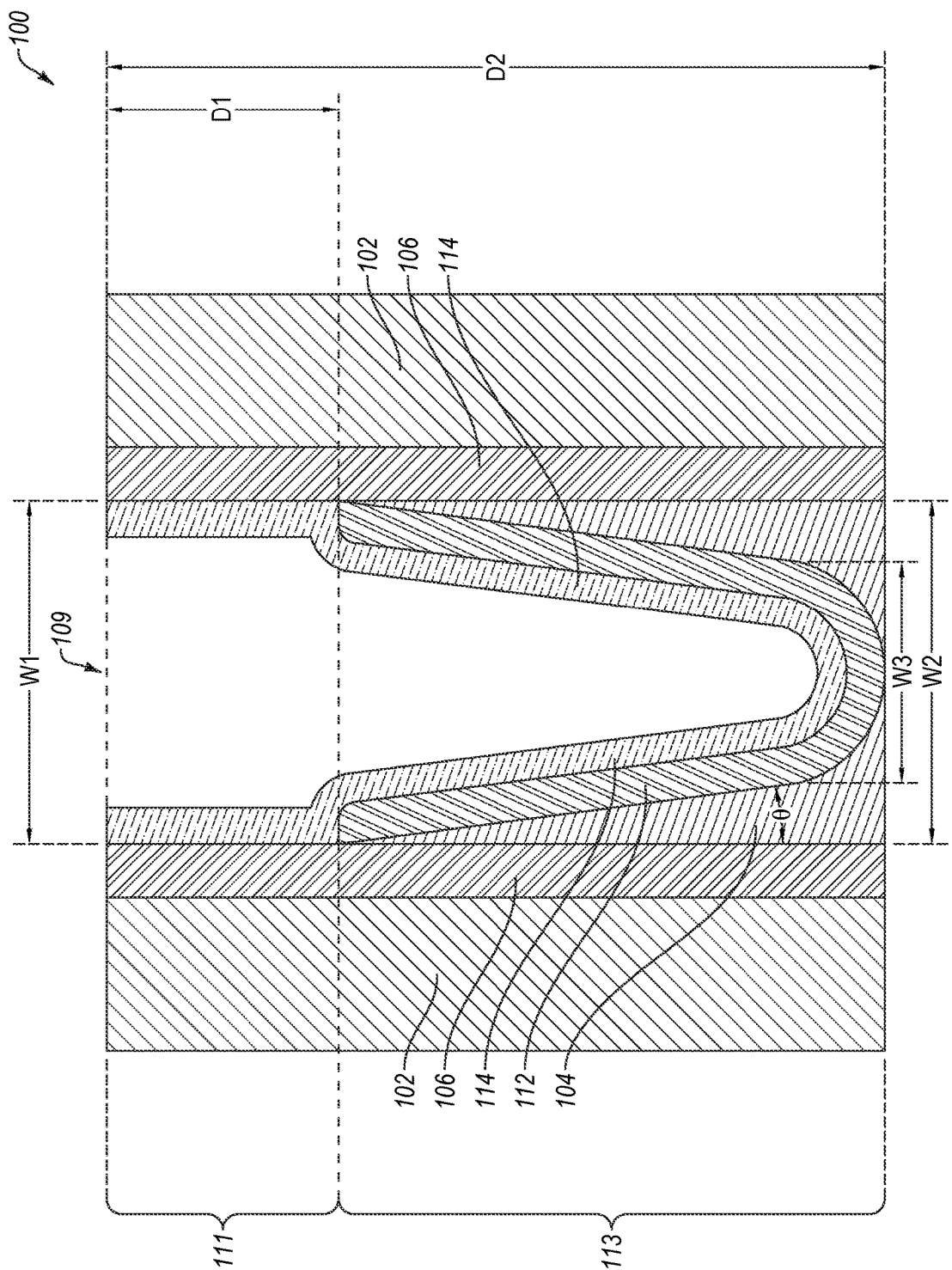

Referring next to FIG. 1E, a metal nitride material 114 may be formed on or over exposed surfaces inside the opening 109. For example, as shown in FIG. 1E, the metal nitride material 114 may be conformally formed on exposed surfaces of the metal silicide material 112 and the dielectric liner material 106 exposed within the opening 109. Within boundaries of the opening 109, the metal nitride material 114 may substantially continuously extend across and substantially cover surfaces of the metal silicide material 112 and the dielectric liner material 106. During formation, portions of the metal nitride material 114 may also be formed outside of the boundaries of the opening 109, but may subsequently be removed while substantially maintaining portions within the boundaries of the opening 109.

As shown in FIG. 1E, when viewed from the X-Z plane, the metal nitride material 114 may be formed to exhibit a parabolic shape (e.g., a U-shape) within the second portion 113 of the opening 109. In some embodiments, a portion of the metal nitride material 114 within vertical boundaries of the second portion 113 of the opening 109 has a parabolic shape in a longitudinal cross-sectional plane (e.g., the X-Z plane).

The metal nitride material 114 may be formed of and include at least one metal nitride. By way of non-limiting example, the metal nitride material 114 may comprise at least one refractory metal nitride, such as one or more nitrides of one or more elements of Groups IIIA, IVA, VA, and VIA of the Periodic Table of Elements, such as one or more of $TiN_y$, $WN_y$, $TaN_y$, and $MoN_y$. In some embodiments, the metal nitride material 114 comprises $TiN_y$ (e.g., TiN).

The metal nitride material 114 may be formed to exhibit a desirable thickness. A thickness of the metal nitride material 114 may, for example, be less than or equal to about 5 nm, such as less than or equal to about 2.5 nm, or less than or equal to about 2 nm. In some embodiments, the thickness of the metal nitride material 114 is within a range of from about 0.5 nm to about 2 nm. In further embodiments, the thickness of the metal nitride material 114 is about 1.5 nm.

The metal nitride material 114 may be formed using one or more conventional conformal deposition processes, such as one or more of a conventional conformal CVD process and a conventional ALD process. For example, the microelectronic device structure 100 (at the processing stage depicted in FIG. 1D) may be provided into a deposition chamber (an ALD chamber, a CVD chamber) configured to receive alternating pulses of at least one metal-containing reactant and at least one nitrogen-containing reactant. The metal-containing reactant may comprise a complex of at least one metal species (e.g., Ti, W, Ta, Co, Mo, Ni) for inclusion in the metal nitride material 114 and at least one ligand formulated to react with the nitrogen-containing reactant to form at least a portion of the metal nitride material 114.

Figure 1F:
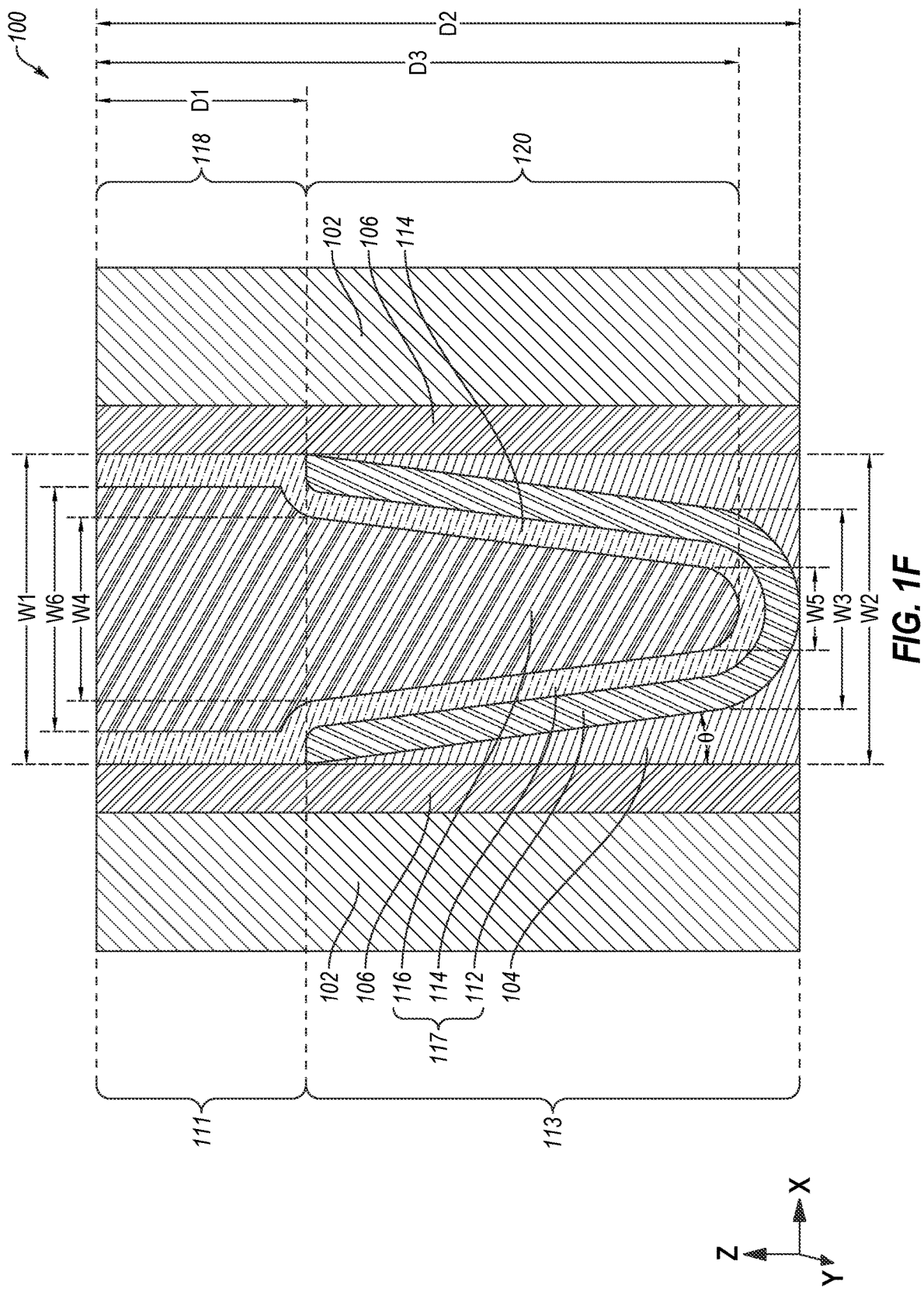

Referring next to FIG. 1F, a conductive material 116 may be formed within a remaining (e.g., unfilled) portion of the opening 109 (FIG. 1E). The conductive material 116 may be formed on or over portions of the metal silicide material 112 and the metal nitride material 114 within the opening 109 (FIG. 1E). Optionally, an upper portion of the conductive material 116 may be formed to extend beyond boundaries (e.g., an upper vertical boundary, horizontal boundaries) of the opening 109 (FIG. 1E). As shown in FIG. 1F, in some embodiments, an upper surface of the conductive material 116 is formed to be substantially coplanar with upper surfaces of the metal nitride material 114, the dielectric liner material 106, and the isolation material 102. In additional embodiments, the conductive material 116 may be formed to vertically extend beyond boundaries (e.g., vertical boundaries, horizontal boundaries) of the opening 109.

As illustrated in FIG. 1F, the metal silicide material 112, the metal nitride material 114, and the conductive material 116 may together form a conductive contact structure 117 of the microelectronic device structure 100. The conductive contact structure 117 may, for example, be employed to couple a device (e.g., a transistor, such as a vertical transistor) including the semiconductive material 104 to an additional device (e.g., a capacitor) subsequently formed to overlie the device, as described in further detail below.

The conductive material 116 of the conductive contact structure 117 may include an upper portion 118 within the boundaries of the first portion 111 of the opening 109 (FIG. 1E), and a lower portion 120 within the boundaries of the second portion 113 of the opening 109 (FIG. 1E). The upper portion 118 of the conductive material 116 may vertically extend (e.g., in the Z-direction) to the first depth D1 of the first portion 111 of the opening 109 (FIG. 1E). The lower portion 120 may vertically terminate at a third depth D3 above the second depth D2 of the opening 109. In some embodiments, the vertical offset between the third depth D3 and the second depth D2 equals the sum of the thickness of the metal silicide material 112 and the thickness of the metal nitride material 114. The lower portion 120 of the conductive material 116 may include a fourth width W4 (e.g., first diameter) at an upper boundary thereof, and a fifth width W5 (e.g., second diameter) less than the fourth width W4 proximate a lower boundary thereof. A vertical height (e.g., in the Z-direction) of the lower portion 120 of the conductive material 116 may equal the third depth D3 minus the first depth D1. As shown in FIG. 1F, in some embodiments, the vertical height of the lower portion 120 of the conductive material 116 is greater than the vertical height (e.g., the first depth D1) of the upper portion 118 of the conductive material 116. In additional embodiments, the vertical height of the upper portion 118 of the conductive material 116 is greater than the vertical height of the lower portion 120 of the conductive material 116.

The upper portion 118 of the conductive material 116 may outwardly horizontally extend beyond maximum horizontal dimensions (e.g., in the X-direction, in the Y-direction) of the lower portion 120 of the conductive material 116. For example, a majority of the upper portion 118 of the conductive material 116 may have a sixth width W6 (e.g., diameter) greater than the fourth width W4 of the lower portion 120 at the upper boundary of the lower portion 120. The sixth width W6 may be substantially uniform, such that the upper portion 118 of the conductive material 116 exhibits horizontal boundaries (e.g., sidewalls) oriented substantially perpendicular to an upper surface of the conductive material 116. As shown in FIG. 1F, a vertically lower region of the upper portion 118 of the conductive material 116 proximate the lower boundary (e.g., as defined by the first depth D1) of the first portion 111 (FIG. 1C) of the opening 109 (FIG. 1C) may exhibit variable widths (e.g., diameters) in downward vertical direction (e.g., the negative Z-direction) from the sixth width W6 to the fourth width W4 of the lower portion 120 at the upper boundary of the lower portion 120. In some embodiments, the upper portion 118 of the conductive material 116 has a substantially uniform width along a vertical height of the upper portion 118 (e.g., the sixth width W6 is equal to the fourth width W4 of the lower portion 120 at the upper boundary of the lower portion 120).

Still referring to FIG. 1F, the lower portion 120 of the conductive material 116 may have a tapered longitudinal cross-sectional profile defining additional widths (e.g., diameters) varying from the fourth width W4 at the upper boundary thereof to the fifth width W5 at the lower boundary thereof. The fourth width W4 of the lower portion 120 may, for example, be within a range of from about 20 nm to about 28 nm, such as from about 22 nm to about 26 nm, or about 24 nm. The fifth width W5 of the lower portion 120 may, for example, be within a range of from about 8 nm to about 14 nm, such as from about 9 nm to about 13 nm, or from about 10 nm to about 12 nm. The ratio of the fifth width W5 of the lower portion 120 of conductive material 116 to the fourth width W4 of the lower portion 120 of conductive material 116 may be within a range of from about 1:7 to about 1:1.5, such as from about 1:5 to about 1:2, about 1:3, or about 1:4. In some embodiments, the conductive material 116 has a substantially dome-shaped surface at the lower boundary thereof to mitigate (e.g., substantially eliminate) oxygen defects created during the first material removal process and/or during the second material removal processes. In some embodiments, the fifth width W5 of the lower portion 120 of the conductive material 116 corresponds to the formula: $W5=W4-2*(\tan(\theta)*(D3-D1))$. In some embodiments, the ratio of the fifth width W5 of the lower portion 120 of the conductive material 116 to the fourth width W4 of the lower portion 120 of the conductive material 116 is within a range of from about 1:5 to about 1:2. The lower portion 120 may be formed to exhibit a desired tapered shape (e.g., cone, dome, pyramid, or any combination thereof).

The conductive material 116 may be formed of and include at least one conductive material. In some embodiments, the conductive material 116 is formed of and includes W. The conductive material 116 may be substantially homogeneous, or may be heterogeneous.

The conductive material 116 may be formed using conventional processes (e.g., conventional material deposition process, conventional material removal processes), which are not described in detail herein. By way of non-limiting example, the conductive material 116 may be non-conformally formed (e.g., non-conformally deposited through one or more of a PVD process and a non-conformal CVD process) on exposed surfaces of the microelectronic device structure 100 inside and outside of the opening 109 (FIG. 1F); and then portions of the conductive material 116 outside of the boundaries of the opening 109 (FIG. 1F) may be removed (e.g., by way of an abrasive planarization process, such as a CMP process) while maintaining additional portions within the boundaries of the opening 109 (FIG. 1F).

Following the formation of the conductive material 116, an upper region of the conductive contact structure 117 may include the upper portion 118 of the conductive material 116 and an upper portion of the metal nitride material 114, but may be substantially free of the metal silicide material 112 within vertical boundaries thereof. In addition a lower region of the conductive contact structure 117 may include the lower portion 120 of the conductive material 116, a lower portion of the metal nitride material 114, and substantially all of the metal silicide material 112 within vertical boundaries thereof. The lower region of the conductive contact structure 117 exhibits a tapered profile. As shown in FIG. 1F, the metal nitride material 114 of the conductive contact structure 117 substantially surrounds outer side surfaces (e.g., outer sidewalls) of the upper portion 118 and the lower portion 120 of the conductive material 116. In addition, the metal silicide material 112 substantially covers outer surfaces of the metal nitride material 114 within vertical boundaries of the second portion 113 (FIG. 1F) of the opening 109 (FIG. 1E).

Aspects (e.g., processing acts and structures) of the methods described above with reference to FIGS. 1A through 1F may be employed in additional methods of forming a microelectronic device to facilitate one or more benefits (e.g., at least some of the benefits effectuated by the methods previously described with reference to FIGS. 1A through 1F, and/or additional benefits) as compared to conventional methods and conventional microelectronic device.

The method described with reference to FIGS. 1A-1F may be employed to facilitate the formation of a microelectronic device structure (e.g., the microelectronic device structure 100 at or after the processing stage depicted in FIG. 1F) exhibiting enhanced properties as compared to conventional methods and conventional microelectronic device structures. For example, forming the opening 109 (FIG. 1F) may increase the surface area of the metal silicide material 112 formed therein by about five or about six times compared to the surface area of a metal silicide material having a conventional geometric configuration formed by conventional processes. The increased surface area of the metal silicide material 112 may, for example, facilitate decreased conductive contact resistances and increased current (e.g., source-drain currents (Ids)) in a microelectronic device including microelectronic device structure 100 as compared to conventional microelectronic devices formed through conventional methods. Furthermore, forming rounded (e.g., arcuate) interfaces between the lower portions of the metal silicide material 112, the metal nitride material 114, and the conductive material 116 may reduce oxide defects that may be created by material removal processes (e.g., etching).

Thus, in accordance with embodiments of the disclosure, a method of forming a microelectronic device comprises forming a tapered opening extending into a semiconductive material. The method additionally comprises substantially covering portions of the semiconductive material exposed within the tapered opening with a metal silicide material. The method further comprises substantially covering surfaces of the metal silicide material within boundaries of the tapered opening with a metal nitride material. The method yet further comprises forming a conductive material over surfaces of the metal nitride material within the boundaries of the tapered opening.

Figure 2:
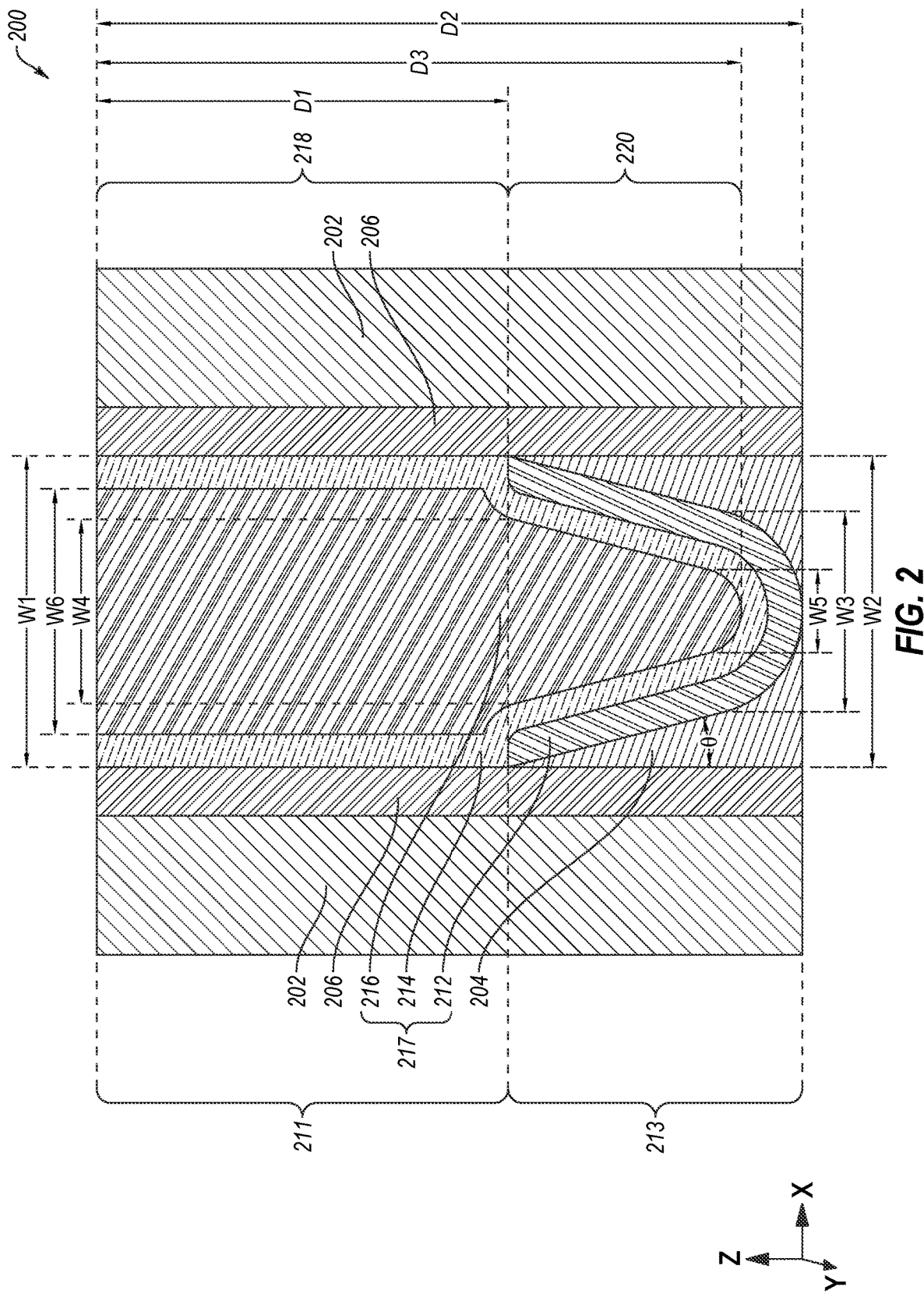
FIG. 2 is a simplified, partial cross-sectional view illustrating a microelectronic device structure, in accordance with an additional embodiment of the disclosure.

In additional embodiments, the conductive contact structure 117 (including the metal silicide material 112, the metal nitride material 114, and the conductive material 116 thereof) and the semiconductive material 104 may be formed to exhibit different geometric configurations than those shown in and previously described with reference to FIG. 1F. For example, FIG. 2 is a simplified, partial cross-sectional view illustrating a microelectronic device structure 200, in accordance with additional embodiments of the disclosure. In FIG. 2 and the associated description, functionally similar features (e.g., structures, materials) are referred to with similar reference numerals incremented by 100. To avoid repetition, not all features shown in FIG. 2 are described in detail herein. Rather, unless described otherwise below, a feature in FIG. 2 designated by a reference numeral that is a 100 increment of the reference numeral of a previously described feature will be understood to be substantially similar to the previously described feature.

The microelectronic device structure 200 shown in FIG. 2 may be substantially similar to and may be formed in substantially the same manner as microelectronic device structure 100 through the processing stage previously described with reference to FIG. 1F, except that the depths D1, D2, D3 and taper angle θ associated with the conductive contact structure 217 are different than those illustrated in FIGS. 1D through 1F. For example, the first depth D1 of the upper portion 218 of the conductive material 216 may be formed to be greater than the first depth D1 of the upper portion 118 (FIG. 1F) of the conductive material 116 (FIG. 1F) of the microelectronic device structure 100 (FIG. 1F); and third depth D3 of the lower portion 220 of the conductive material 216 may be formed to be less than the third depth D3 of the lower portion 120 (FIG. 1F) of the conductive material 116 (FIG. 1F) of the microelectronic device structure 100 (FIG. 1F). As a result, the taper angle θ of portions of each of the semiconductive material 204, the metal silicide material 212, the metal nitride material 214, and the lower portion 220 of the conductive material 216 within vertical boundaries of the second portion 213 of an opening (e.g., corresponding to the opening 109 (FIGS. 1C-1E)) employed to form the conductive contact structure 217 may be greater than the taper angle θ of portions of each of the semiconductive material 104, the metal silicide material 112, the metal nitride material 114, and the lower portion 120 of the conductive material 116 of the conductive contact structure 117 of the microelectronic device structure 100.

Figure 3:
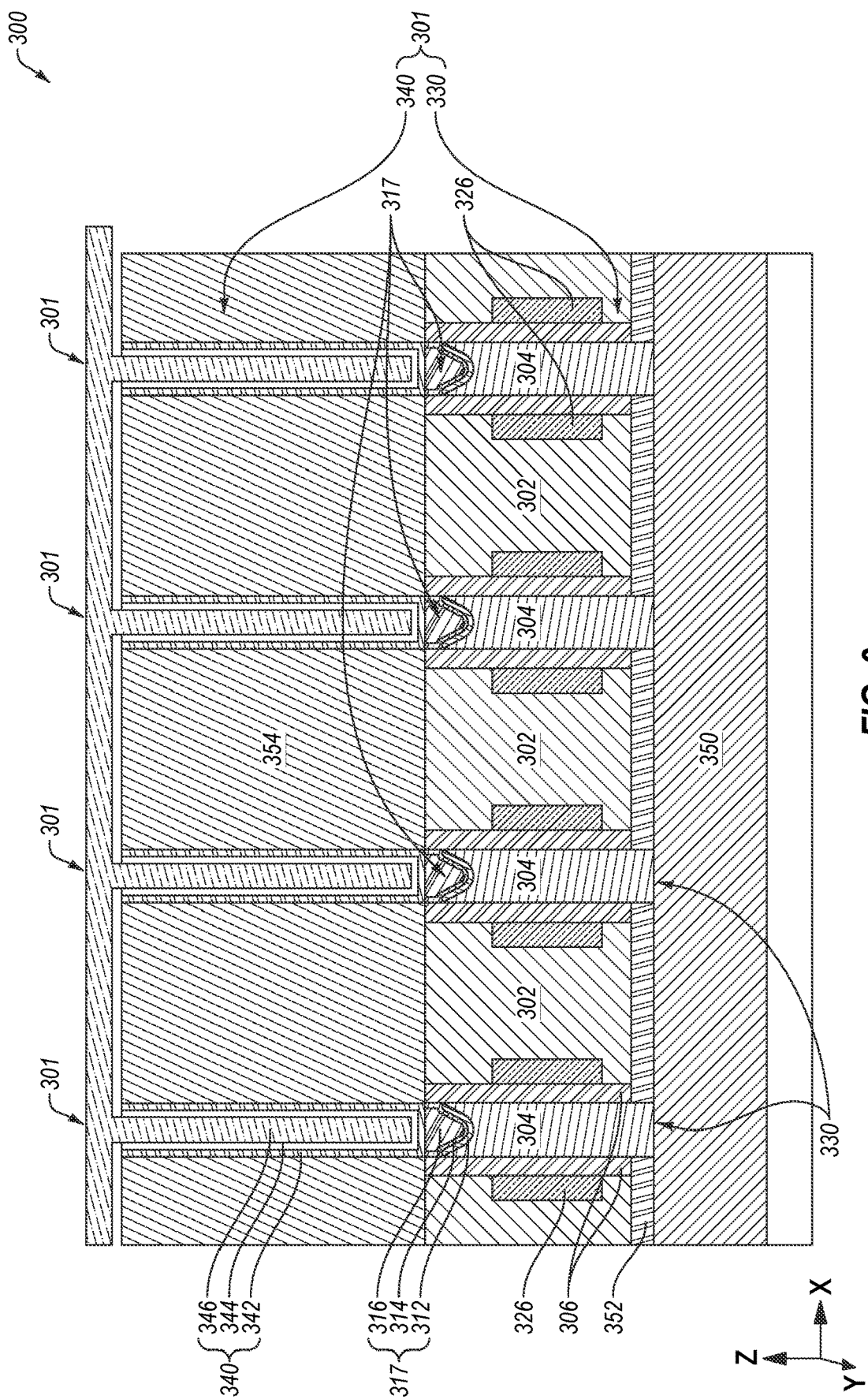
FIG. 3 is a simplified, partial cross-sectional view of microelectronic device structure including multiple memory cells, in accordance with embodiments of the disclosure.

Conductive contact structures (e.g., the conductive contact structures 117, 217) of the disclosure may be included in memory cells of the disclosure. For example, FIG. 3 is a simplified, partial cross-sectional view of a microelectronic device structure 300 including an array of memory cells 301, in accordance with embodiments of the disclosure. An individual memory cell 301 of the microelectronic device structure 300 may include a vertical transistor 330, and a capacitor 340 vertically overlying the vertical transistor 330. As described in further detail below, the vertical transistor 330 may include a conductive contact structure 317 substantially similar to and formed in substantially the same manner as one of the conductive contact structure 117 (FIG. 1F) and the conductive contact structure 217 (FIG. 2) previously described herein. The conductive contact structure 317 may be vertically interposed between a semiconductive material 304 of the vertical transistor 330 and the capacitor 340. The microelectronic device structure 300, including each memory cell 301 thereof, further includes additional features (e.g., structures, materials, devices), as described in further detail below.

The conductive contact structure 317 of an individual vertical transistor 330 of an individual memory cell 301 may be used to couple the vertical transistor 330 of the memory cell 301 to the capacitor 340 of the memory cell 301. The conductive contact structure 317 may be employed as a contact for the vertical transistor 330. The conductive contact structure 317 may include a metal silicide material 312, a metal nitride material 314, and a conductive material 316. The metal silicide material 312, the metal nitride material 314, and the conductive material 316 may respectively be substantially similar to and may individually be formed in substantially the same manner as the metal silicide material 112 (FIG. 1F), the metal nitride material 114 (FIG. 1F), and the conductive material 116 (FIG. 1F) of the conductive contact structure 117 (FIG. 1F) previously described herein.

Still referring to FIG. 3, the vertical transistor 330 of each memory cell 301 may further include semiconductive material 304, one or more (e.g., one, two) gate electrodes 326 laterally neighboring and within vertical boundaries of the semiconductive material 304, and a dielectric liner material 306 laterally intervening between the semiconductive material 304 and the at least one gate electrode 326.

For an individual vertical transistor 330, the semiconductive material 304 may be employed as a channel material for the vertical transistor 330. The semiconductive material 304 may be substantially similar to and may be formed in substantially the same manner as the semiconductive material 104 (FIG. 1F) previously described herein. In addition, the dielectric liner material 306 may be employed as a gate dielectric material for the vertical transistor 330. The dielectric liner material 306 may be substantially similar to the dielectric liner material 106 (FIG. 1F) previously described herein.

As shown in FIG. 3, in some embodiments, an individual vertical transistor 330 is formed to exhibit a "double-gated" configuration wherein the vertical transistor 330 includes two gate electrodes 326 laterally neighboring two opposing sides of the semiconductive material 304, and portions of the dielectric liner material 306 laterally intervenes between the semiconductive material 304 and each of the two gate electrodes 326. In addition embodiments, as individual vertical transistor 330 is be formed to exhibit a "single-gate"

configuration wherein the vertical transistor 330 includes one of the gate electrodes 326 laterally neighboring a side of the semiconductive material 304, but does not include one of the gate electrodes 326 laterally neighboring an opposing side of the semiconductive material 304. For example, an isolation material 302 may laterally neighbor the opposing side of the semiconductive material 304 in place of a second gate electrode 326.

The gate electrodes 326 may be formed of and include at least one conductive material, such as one or more of a metal, a metal alloy, a conductive metal oxide, a conductive metal nitride, a conductive metal silicide, and a conductively doped semiconductor material. The gate electrodes 326 may, for example, be formed of and include one or more of W, WN, Ni, Ta, TaN, TaSi, Pt, Cu, Ag, Au, Al, Mo, Ti, TiN, TiSi, TiSiN, TiAlN, MoN, Ir, IrO$_x$, Ru, RuO$_x$, RuTiN, and conductively doped silicon.

Still referring to FIG. 3, for an individual memory cell 301, the capacitor 340 thereof may be coupled to the vertical transistor 330 thereof. In some embodiments, for an individual memory cell 301, the capacitor 340 thereof is at least partially (e.g., substantially) horizontally aligned with the vertical transistor 330 thereof. In additional embodiments, for an individual memory cell 301, the capacitor 340 thereof is horizontally offset from with the vertical transistor 330 thereof. In such embodiments, a redistribution structure may be employed to couple the capacitor 340 of the memory cell 301 to the vertical transistor 330 of the memory cell 301. The capacitor 340 may be configured to store a charge representative of a programmable logic state. In some embodiments, the capacitor 340 of an individual memory cell 301 comprises a ferroelectric capacitor. The capacitor 340 may, for example, including a first electrode 342 (e.g., a lower electrode), a second electrode 346 (e.g., an upper electrode), and a dielectric structure 344 between the first electrode 342 and the second electrode 346. The first electrode 342 and the second electrode 346 may each individually comprise at least one conductive material (e.g., one or more of W, WN, Ni, Ta, TaN, TaSi, Pt, Cu, Ag, Au, Al, Mo, Ti, TiN, TiSi, TiSiN, TiAlN, MoN, Ir, IrOx, Ru, RuO$_x$, RuTiN, and conductively doped silicon). The dielectric structure 344 may, for example, comprise a high dielectric constant (HDC) dielectric material (e.g., a dielectric material having a dielectric constant greater than or equal to about 20), such as one or more of barium strontium titanate (BST), lead ziconate titanate (PZT), lead lanthanum zirconate titanate (PLZT), lead scandium tantalate (PST), strontium bismuth tantalate (SBT), barium bismuth tantalate (BBT), barium titanate (BT), strontium titanate (ST), and tantalum pentoxide (Ta$_2$O$_5$).

As shown in FIG. 3, the microelectronic device structure 300 may further include isolation material 302 laterally intervening between each vertical transistor 330 and vertically overlying linear conductive structures 350, optional additional linear conductive structures 352 vertically interposed between the isolation material 302 and the linear conductive structures 350, and an additional isolation material 354 vertically overlying the isolation material 302 and laterally intervening between each capacitor 340.

The isolation material 302 may be formed to horizontally intervene between horizontally neighboring vertical transistors 330. The isolation material 302 may extend from and between vertical boundaries of the dielectric liner material 306 of the vertical transistors 330. The isolation material 302 may be substantially similar to and may be formed in substantially the same manner as the isolation material 102 (FIG. 1F) previously described herein.

The linear conductive structures 350 may be formed of and include at least one conductive material, such as one or more of a metal, an alloy, a conductive metal oxide, a conductive metal nitride, a conductive metal silicide, and a conductively doped semiconductor material. By way of non-limiting example, the linear conductive structures 350 may individually be formed of and include one or more of Ru, W, WN$_x$, Ni, Ta, TaN$_x$, TaSi$_x$, Pt, Cu, Ag, Au, Al, Mo, Ti, TiN$_x$, TiSi$_x$, TiSi$_x$N$_y$, TiAl$_x$N$_y$, MoN$_x$, Ir, IrOx, RuO$_x$, RuTi$_x$N$_y$, and conductively doped silicon. In some embodiments, the linear conductive structures 350 serve as digit lines (e.g., data lines, bit lines) for the microelectronic device structure. The microelectronic device structure 300 may be formed to include multiple rows of the linear conductive structures 350 extending in parallel in the X-direction and separated from one another in the Y-direction. Each linear conductive structure 350 may be coupled to and shared by a row of the memory cells 301.

The linear conductive structures 350 may be formed to exhibit desired lateral dimensions (e.g., X-direction, Y-direction). For example, the dimensions of an individual linear conductive structure 350 may be selected at least partially based on a function of the microelectronic device structure 300 and on dimensions and desired spacing of additional components (e.g., transistors). Individual linear conductive structures 350 may exhibit relatively larger dimensions in a first lateral direction (e.g., X-direction) and exhibit relatively smaller dimensions in a second lateral direction (e.g., Y-direction), perpendicular to the first lateral direction.

The additional linear conductive structures 352 (if any) may be formed on or over the linear conductive structures 350. The additional linear conductive structures 352 may laterally extend in substantially the same direction (e.g., X-direction), and may exhibit substantially similar lateral dimensions (e.g., in the X-direction, in the Y-direction) as the linear conductive structures 350. As shown in FIG. 3, if formed, the additional linear conductive structures 352 may exhibit a reduced thickness (e.g., in the Z-direction) relative to the linear conductive structures 350. Portions of the additional linear conductive structures 352 may be removed such that the semiconductive material 304 of the vertical transistors 330 vertically extends to upper surfaces of the linear conductive structures 350.

Each individual additional linear conductive structure 352 (if formed) may serve as a contact shared by a row of the vertical transistors 330 (and, hence, a row of the memory cells 301). The additional linear conductive structure 352 may be formed of and include at least one conductive material, such as one or more of a metal, an alloy, a conductive metal oxide, a conductive metal nitride, a conductive metal silicide, and a conductively doped semiconductor material. By way of non-limiting example, the additional linear conductive structures 352 may individually be formed of and include one or more of Ru, W, WN$_x$, Ni, Ta, TaN$_x$, TaSi$_x$, Pt, Cu, Ag, Au, Al, Mo, Ti, TiN$_x$, TiSi$_x$, TiSi$_x$N$_y$, TiAl$_x$N$_y$, MoN$_x$, Ir, IrOx, RuO$_x$, RuTi$_x$N$_y$, and conductively doped silicon.

Still referring to FIG. 3, the additional isolation material 354 may be formed to horizontally intervene between horizontally neighboring capacitors 340. The additional isolation material 354 may extend from and between vertical boundaries of the first electrodes 342 of the capacitors 340. To form the capacitors 340, portions of the additional isolation material 354 may be removed to form openings in the additional isolation material 354, and then the material of the capacitors 340 may formed within the openings.

The additional isolation material 354 may be formed of an insulative material, such as one or more of a dielectric oxide material (e.g., $SiO_x$) and a dielectric nitride material (e.g., $SiN_y$). In some embodiments, the additional isolation material 354 is formed of and includes $SiO_2$. In additional embodiments, the additional isolation material 354 is formed of and includes $Si_3N_4$.

While FIG. 3 depicts memory cells 301 individually including a vertical transistor 330 operatively associated with a conductive contact structure 317 of the disclosure, the disclosure is not so limited. Rather, conductive contact structures of the disclosure may be operatively associated with horizontal transistors of the disclosure included in additional memory cells of the disclosure. For example, FIG. 4 is a simplified, partial cross-sectional view illustrating a microelectronic device structure 400 including a horizontal transistor 430, in accordance with embodiments of the disclosure.

Figure 4:
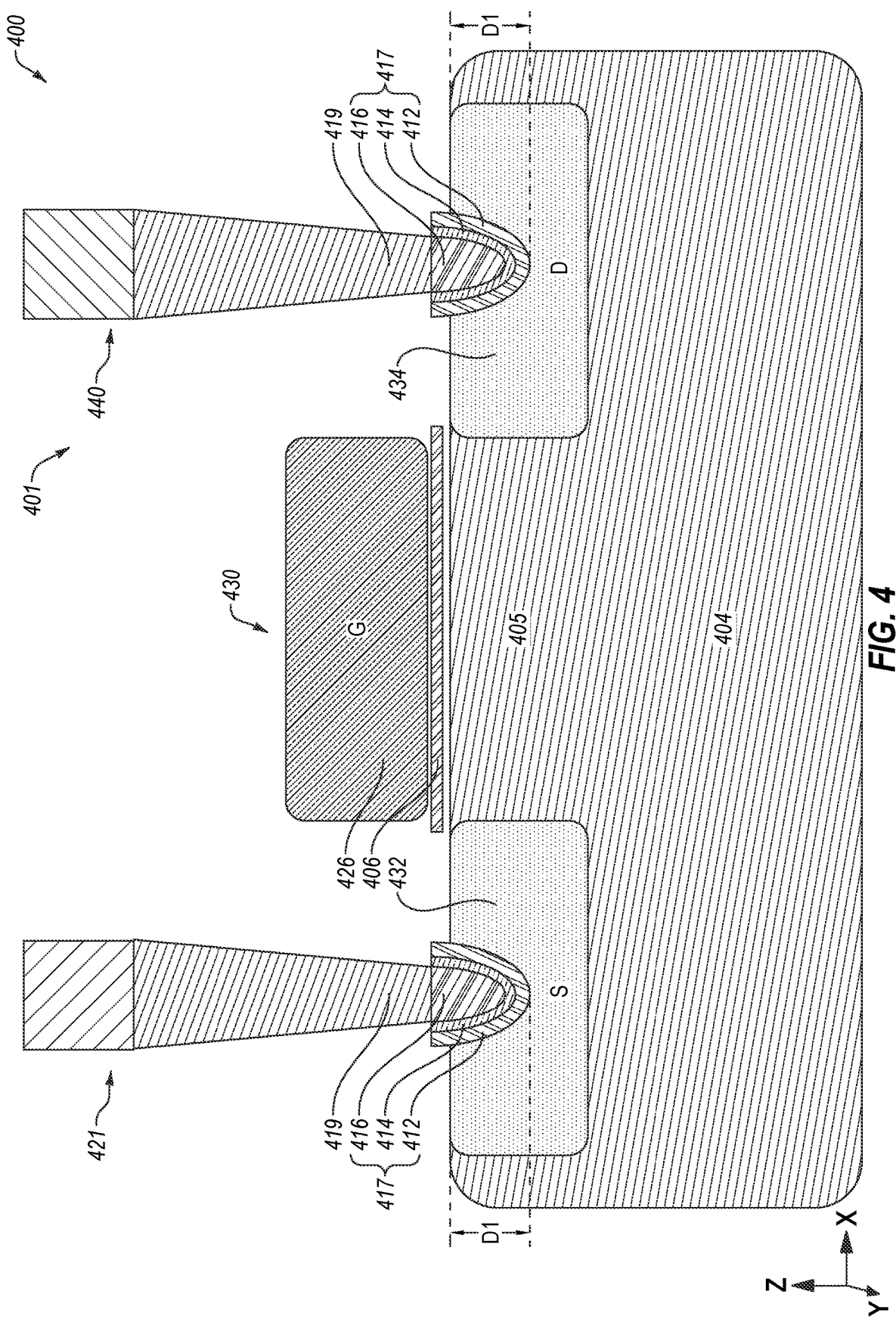
FIG. 4 is a simplified, partial cross-sectional view of a microelectronic device structure including a horizontal transistor, in accordance with further embodiments of the disclosure.

As shown in FIG. 4, a horizontal transistor 430 includes a source region 432, a drain region 434, a channel region 405 horizontally interposed between the source region 432 and the drain region 434, a gate electrode 426 vertically over and within horizontal boundaries of the channel region 405, and a dielectric material 406 vertically interposed between the channel region 405 and the gate electrode 426. The source region 432, the drain region 434, and the channel region 405 may each be portions of a semiconductive material 404. In some embodiments, the gate electrode 426 is formed vertically above an uppermost boundary of the semiconductive material 404, and the dielectric material 406 is vertically interposed between the uppermost boundary of the semiconductive material 404 and the gate electrode 426. In additional embodiments, the gate electrode 426 is formed at least partially (e.g., substantially) vertically below the uppermost boundary of the semiconductive material 404. For example, the gate electrode 426 may be formed to be at least partially (e.g., substantially) embedded within the semiconductive material 404. In such embodiment, the dielectric material 406 is interposed between the semiconductive material 404 and the gate electrode 426. The channel region 405 follows an arcuate path around peripheral portions of the gate electrode 426 and the dielectric material 406 within the semiconductive material 404.

As shown in FIG. 4, the microelectronic device structure 400 further includes conductive contact structures 417 operatively associated with the source region 432 and the drain region 434 of an individual horizontal transistor 430. The conductive contact structures 417 may be employed to couple the horizontal transistor 430 to additional structures of the microelectronic device structure 400. For example, the conductive contact structure 417 operatively associated with the drain region 434 of the horizontal transistor 430 may couple the horizontal transistor 430 to a capacitor 440 to form a memory cell 401. Additionally, the conductive contact structure 417 operatively associated with the source region 434 of the horizontal transistor 430 may couple the horizontal transistor 430 to a conductive line structure 421 (e.g., a conductive line structure, such as a digit line structure).

Each conductive contact structure 417 may individually be formed within the source region 432 or the drain region 434 of the horizontal transistor 430. In addition, each conductive contact structure 417 may include a metal silicide material 412, a metal nitride material 414 on or over the metal silicide material 412, and a conductive material 416 on or over the metal nitride material 414.

The conductive contact structures 417 (including the metal silicide material 412, the metal nitride material 414, and the conductive material 416 thereof) of the horizontal transistor 430 may individually be formed to have geometric configurations (e.g., dimensions, shapes) similar to as a portion (e.g., lower portion) of the conductive contact structure 117 (FIG. 1F) formed within the second portion 113 (FIG. 1F) of the opening 109 (FIG. 1E). For example, the microelectronic device structure 400 may be subjected to at least one material removal process (e.g., etching) to remove portions of material (e.g., doped semiconductive material) within the source region 432 and the drain region 434 and form openings within each of the source region 432 and the drain region 434 to a depth D1. In some embodiments, the depth D1 (e.g., vertical height) of each of the openings (and, hence, of the conductive contact structures 417) is less than or equal to 40 nm, such as from about 10 nm to about 35 nm, from about 12 nm to about 27 nm, or from about 17 nm to about 20 nm. The material removal process may form the openings to have tapered profiles within the source region 432 and the drain region 434 substantially similar to that of the second portion 113 (FIG. 1E) of the opening 109 (FIG. 1E). Following the formation of the openings, the metal silicide material 412, the metal nitride material 414, and the conductive material 416 may be formed, in sequence, within the openings. The metal silicide material 412, the metal nitride material 414, and the conductive material 416 may have material compositions and thicknesses substantially similar to and may be formed in substantially the same manner as the metal silicide material 112 (FIG. 1F), the metal nitride material 114 (FIG. 1F), and the conductive material 116 (FIG. 1F) previously described herein, respectively.

The metal silicide material 412 and the metal nitride material 414 may individually be formed to exhibit a parabolic shape (e.g., a U-shape) within the source region 432 and the drain region 434 when viewed from the X-Z plane. In addition, as shown in FIG. 4, uppermost surfaces of the metal silicide material 412, the metal nitride material 414, and the conductive material 416 may be formed to be substantially coplanar one another. In some embodiments, the uppermost surfaces of the conductive contact structures 417 (including the uppermost surfaces of the metal silicide material 412, the metal nitride material 414, and the conductive material 416 thereof) are formed to be substantially coplanar with uppermost surfaces of the source region 432 and the drain region 434. In additional embodiments, the uppermost surfaces of the conductive contact structures 417 are formed to be vertically offset from the uppermost surfaces of the source region 432 and the drain region 434. As shown in FIG. 4, the conductive contact structures 417 may be coupled to additional conductive structures 419 to couple the conductive contact structures 417 (and, hence, the horizontal transistor 430) to additional features (e.g., structures, materials, devices) of a microelectronic device formed to include the horizontal transistor 430.

With continued reference to FIG. 4, the semiconductive material 404 may be formed of and include at least one semiconductive material, such as one or more of a silicon material, a silicon-germanium material, a germanium material, a gallium arsenide material, a gallium nitride material, and an indium phosphide material. By way of non-limiting example, the semiconductive material 404 may be formed of and include at least one silicon material (e.g., monocrystalline silicon, polycrystalline silicon).

The source region 432 and the drain region 434 of the horizontal transistor 430 may comprise conductively-doped regions of the semiconductive material 404. In some embodiments, the source region 432 and the drain region 434 individually comprise semiconductor material (e.g., polysilicon) doped with one or more P-type dopants (e.g., one or more of boron, aluminum, and gallium). In additional embodiments, the source region 432 and the drain region 434 individually comprise semiconductor material (e.g., polysilicon) doped with one or more N-type conductivity materials (e.g., one or more of arsenic, phosphorous, antimony, and bismuth).

The channel region 405 of the horizontal transistor 430 may comprise a doped region or an undoped region of the semiconductive material 404. In some embodiments, the channel region 405 comprises a substantially undoped region of the semiconductive material 404.

The gate electrode 426 of the horizontal transistor 430 may be formed of and include at least one conductive material, such as one or more of a metal, an alloy, a conductive metal oxide, a conductive metal nitride, a conductive metal silicide, and a conductively doped semiconductive material. The gate electrode 426 may, for example, be formed of and include one or more of W, $WN_y$, Ni, Ta, $TaN_y$, $TaSi_x$, Pt, Cu, Ag, Au, Al, Mo, Ti, $TiN_y$, $TiSi_x$, $TiSi_xN_y$, $TiAl_xN_y$, $MoN_x$, Ir, $IrO_z$, Ru, and $RuO_z$.

Figure 5:
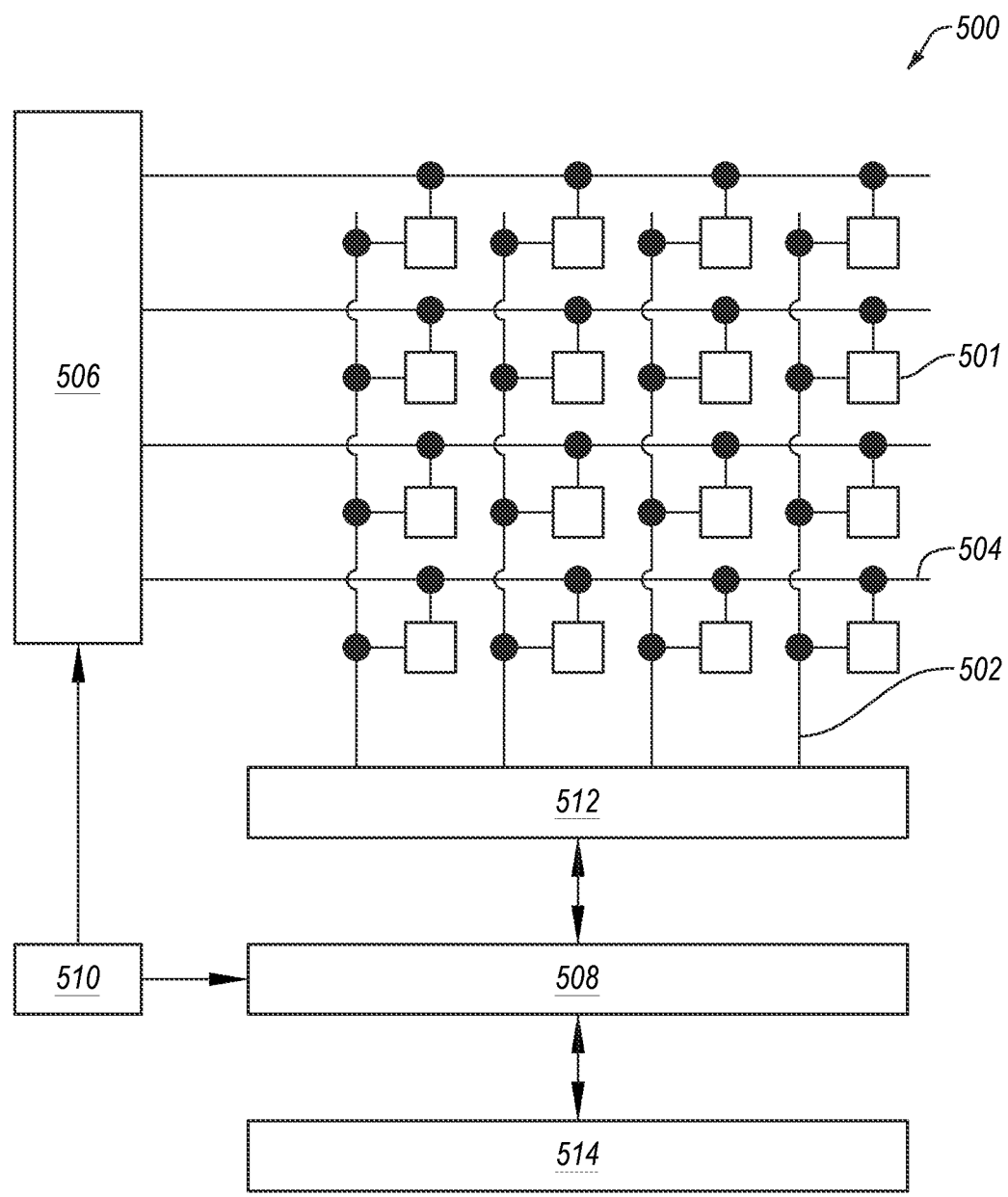
FIG. 5 is a functional block diagram of a memory device, in accordance with embodiments of the disclosure.

Microelectronic device structures (e.g., the microelectronic device structures 100, 200, 300, 400 previously described with reference to FIGS. 1F, 2, 3, and 4, respectively) of the disclosure may be included microelectronic devices (e.g., memory devices) of the disclosure. For example, referring next to FIG. 5, illustrated is a functional block diagram of the memory device 500, in accordance with an embodiment of the disclosure. The memory device 500 may include, for example, an embodiment of one or more of the microelectronic device structures (e.g., microelectronic device structures 100, 200, 300, 400) previously described herein. As shown in FIG. 5, the memory device 500 may include memory cells 501, digit lines 502, word lines 504, a row decoder 506, a column decoder 508, a memory controller 510, a sense device 512, and an input/output device 514.

The memory cells 501 of the memory device 500 may, for example, correspond to the memory cell 301 previously described herein with reference to FIG. 3. The memory cells 501 are programmable to at least two different logic states (e.g., logic 0 and logic 1). Portions of the microelectronic device structures 100, 200, 300, 400 previously described herein may form portions of the memory cells 501 of the memory device 500. Each memory cell 501 may individually include a capacitor (e.g., the capacitor 340 (FIG. 3)) and a transistor (e.g., the vertical transistor 330 (FIG. 3), or the horizontal transistor 430 (FIG. 4)) previously described herein. The capacitor stores a charge representative of the programmable logic state (e.g., a charged capacitor may represent a first logic state, such as a logic 1; and an uncharged capacitor may represent a second logic state, such as a logic 0) of the memory cell 501. The transistor grants access to the capacitor upon application of a minimum threshold voltage to a semiconductive channel thereof for operations (e.g., reading, writing, rewriting) on the storage node structure.

The digit lines 502 are connected to the capacitors (e.g., the capacitors 340 (FIG. 3)) of the memory cells 501 by way of the transistors of the memory cells 501. The word lines 504 extend perpendicular to the digit lines 502, and are connected to gates of the transistors of the memory cells 501. Operations may be performed on the memory cells 501 by activating appropriate digit lines 502 and word lines 504.

Activating a digit line 502 or a word line 504 may include applying a voltage potential to the digit line 502 or the word line 504. Each column of memory cells 501 may individually be connected to one of the digit lines 502, and each row of the memory cells 501 may individually be connected to one of the word lines 504. Individual memory cells 501 may be addressed and accessed through the intersections (e.g., cross points) of the digit lines 502 and the word lines 504.

The memory controller 510 may control the operations of memory cells 501 through various components, including the row decoder 506, the column decoder 508, and the sense device 512. The memory controller 510 may generate row address signals that are directed to the row decoder 506 to activate (e.g., apply a voltage potential to) predetermined word lines 504, and may generate column address signals that are directed to the column decoder 508 to activate (e.g., apply a voltage potential to) predetermined digit lines 502. The memory controller 510 may also generate and control various voltage potentials employed during the operation of the memory device 500. In general, the amplitude, shape, and/or duration of an applied voltage may be adjusted (e.g., varied), and may be different for various operations of the memory device 500.

During use and operation of the memory device 500, after being accessed, a memory cell 501 may be read (e.g., sensed) by the sense device 512. The sense device 512 may compare a signal (e.g., a voltage) of an appropriate digit line 502 to a reference signal in order to determine the logic state of the memory cell 501. If, for example, the digit line 502 has a higher voltage than the reference voltage, the sense device 512 may determine that the stored logic state of the memory cell 501 is a logic 1, and vice versa. The sense device 512 may include transistors and amplifiers to detect and amplify a difference in the signals (commonly referred to in the art as "latching"). The detected logic state of a memory cell 501 may be output through the column decoder 508 to the input/output device 514. In addition, the memory cell 501 may be set (e.g., written) by similarly activating an appropriate word line 504 and an appropriate digit line 502 of the memory device 500. By controlling the 502 while the word line 504 is activated, the memory cell 501 may be set (e.g., a logic value may be stored in the memory cell 501). The column decoder 508 may accept data from the input/output device 514 to be written to the memory cells 501. Furthermore, a memory cell 501 may also be refreshed (e.g., recharged) by reading the memory cell 501. The read operation will place the contents of the memory cell 501 on the appropriate digit line 502, which is then pulled up to full level (e.g., full charge or discharge) by the sense device 512. When the word line 504 associated with the memory cell 501 is deactivated, all of memory cells 501 in the row associated with the word line 504 are restored to full charge or discharge.

Accordingly, in at least some embodiments, a memory device comprises word lines, digit lines, and memory cells coupled to the word lines and the digit lines. Each memory cell comprises a vertical transistor and a capacitor. The vertical transistor comprises a lower contact structure, a channel structure, at least one gate electrode, and an upper contact structure. The lower contact structure is coupled to one of the digit lines. The channel structure at least partially vertically overlies the lower contact structure. The at least one gate electrode horizontally neighbors the channel structure. The upper contact structure partially vertically overlies the channel structure. The upper contact structure comprises a lower portion and an upper portion. The lower portion vertically extends into the channel structure and exhibits decreasing horizontal cross-sectional areas at progressively lower vertical elevations within the channel structure. The upper portion vertically overlies an uppermost boundary of the channel structure and exhibits a substantially uniform horizontal cross-sectional area across at least a majority of a vertical height thereof. The capacitor vertically overlies and is coupled to the upper portion of the upper conductive contact structure of the vertical transistor.

Microelectronic device structures (e.g., the microelectronic device structures 100, 200, 300, 400 previously described with reference to FIGS. 1F, 2, 3, and 4, respectively) and microelectronic devices (e.g., the memory device 500 previously described with reference to FIG. 5) of the disclosure may be included in electronic systems of the disclosure. For example, referring to FIG. 6, illustrated a functional block diagram of an electronic system 600, in accordance with embodiments of the disclosure. The electronic system 600 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 600 includes at least one memory device 602. The memory device 602 may comprise, for example, an embodiment of one or more of a microelectronic device structure (e.g., the microelectronic device structures 100, 200, 300, 400) and a microelectronic device (e.g., the memory device 500) previously described herein. The electronic system 600 may further include at least one electronic signal processor device 604 (often referred to as a "microprocessor"). The electronic signal processor device 604 may, optionally, include an embodiment of a microelectronic device structure (e.g., the microelectronic device structures 100, 200, 300, 400) and a microelectronic device (e.g., the memory device 500) previously described herein. While the memory device 602 and the electronic signal processor device 604 are depicted as two (2) separate devices in FIG. 6, in additional embodiments, a single (e.g., only one) memory/processor device having the functionalities of the memory device 602 and the electronic signal processor device 604 is included in the electronic system 600. In such embodiments, the memory/processor device may include one or more of a microelectronic device structure (e.g., the microelectronic device structures 100, 200, 300, 400) and a microelectronic device (e.g., the memory device 500) previously described herein. The electronic system 600 may further include one or more input devices 606 for inputting information into the electronic system 600 by a user, such as, for example, a mouse or other pointing device, a keyboard, a touchpad, a button, or a control panel. The electronic system 600 may further include one or more output devices 608 for outputting information (e.g., visual or audio output) to a user such as, for example, a monitor, a display, a printer, an audio output jack, and/or a speaker. In some embodiments, the input device 606 and the output device 608 may comprise a single touchscreen device that can be used both to input information to the electronic system 600 and to output visual information to a user. The input device 606 and the output device 608 may communicate electrically with one or more of the memory device 602 and the electronic signal processor device 604.

Accordingly, in some embodiments, an electronic system comprises an input device, an output device, a processor device operably coupled to the input device and the output device, and a memory device operably coupled to the processor device. The memory device comprises a semiconductive material and a tapered conductive contact structure vertically extending into the semiconductive material. The tapered conductive contact structure comprises a metal silicide material, a metal nitride material, and a conductive material. The metal silicide material is on the semiconductive material and is substantially horizontally surrounded by the semiconductive material across an entire vertical height of the metal silicide material. The metal nitride material is on the metal silicide material and is substantially horizontally surrounded by the metal silicide material across less than or equal to an entire vertical height of the metal nitride material. The conductive material is on the metal nitride material and is substantially horizontally surrounded by the metal nitride material across less than or equal to an entire vertical height of the conductive material.

The methods of the disclosure may facilitate the formation of microelectronic devices (e.g., microelectronic devices, transistors, memory devices) and systems (e.g., electronic systems) having one or more of increased performance, increased efficiency, increased reliability, and increased durability as compared to conventional devices (e.g., conventional access devices, conventional semiconductor devices, conventional memory devices) and conventional systems (e.g., conventional electronic systems).

While the disclosure is susceptible to various modifications and alternative forms, specific embodiments have been shown by way of example in the drawings and have been described in detail herein. However, the disclosure is not intended to be limited to the particular forms disclosed. Rather, the disclosure is to cover all modifications, equivalents, and alternatives falling within the scope of the disclosure as defined by the following appended claims and their legal equivalents. For example, elements and features disclosed in relation to one embodiment of the disclosure may be combined with elements and features disclosed in relation to other embodiments of the disclosure.

What is claimed is:

1. A microelectronic device, comprising:
   a conductive structure comprising:
      a first portion having a first width; and
      a second portion under the first portion and extending into a semiconductive material, the second portion having a tapered profile defining additional widths varying from the first width at an upper boundary of the second portion to a second width less than the first width at a lower boundary of the second portion, a ratio of the second width to the first width being within a range of from about 1:5 to about 1:2;
   a metal nitride material substantially surrounding outer surfaces of the first portion and the second portion of the conductive structure; and
   a metal silicide material substantially covering outer surfaces of the metal nitride material within vertical boundaries of the second portion of the conductive structure.

2. The microelectronic device of claim 1, wherein outer surfaces of the metal silicide material are substantially surrounded by the semiconductive material.

3. The microelectronic device of claim 1, wherein the lower boundary of the second portion of the conductive structure exhibits a dome shape.

4. The microelectronic device of claim 1, wherein:
   the first portion of the conductive structure has a first vertical height; and the second portion of the conductive structure has a second vertical height different than the first vertical height.

5. The microelectronic device of claim 1, wherein a lower portion of the metal nitride material substantially surrounding outer surfaces of the second portion of the conductive structure exhibits a parabolic shape in a longitudinal cross-sectional plane.

6. The microelectronic device of claim 5, wherein the metal silicide material exhibits the parabolic shape in the longitudinal cross-sectional plane.

7. The microelectronic device of claim 1, wherein a taper angle of the second portion of the conductive structure is within a range of from about 5° to about 15° as measured from a direction perpendicular to the upper boundary of the second portion of the conductive structure.

8. The microelectronic device of claim 1, wherein the semiconductive material substantially horizontally surrounds the second portion of the conductive structure across an entire vertical height of the second portion of the conductive structure.

9. The microelectronic device of claim 1, wherein:
the metal silicide material comprises cobalt silicide;
the metal nitride material comprises titanium nitride; and
the conductive structure comprises tungsten.

10. The microelectronic device of claim 1, wherein a thickness of the metal silicide material is within a range of from about 4 nm to about 10 nm.

11. A microelectronic device, comprising:
a conductive structure comprising:
a first portion having a first width; and
a second portion under the first portion and extending into a polysilicon material, the second portion having a tapered profile defining additional widths varying from the first width at an upper boundary of the second portion to a second width less than the first width at a lower boundary of the second portion;
a metal nitride material substantially surrounding outer surfaces of the first portion and the second portion of the conductive structure; and
a metal silicide material substantially covering outer surfaces of the metal nitride material within vertical boundaries of the second portion of the conductive structure.

12. A method of forming a microelectronic device, comprising:
forming a tapered opening extending into a semiconductive material;
substantially covering portions of the semiconductive material exposed within the tapered opening with a metal silicide material;
forming a metal nitride material to substantially cover surfaces of the metal silicide material within boundaries of the tapered opening and surfaces of an insulative material vertically overlying the metal silicide material, the surfaces of the insulative material partially defining the tapered opening; and
forming a conductive material over surfaces of the metal nitride material within the boundaries of the tapered opening.

13. The method of claim 12, wherein forming a tapered opening comprises:
forming a first portion of the tapered opening to exhibit a substantially uniform width across a vertical height thereof; and
forming a second portion of the tapered opening underlying the first portion to exhibit a tapered profile defined by additional widths varying from a first width at an upper boundary of the second portion to a second width proximate a lower boundary of the second portion.

14. The method of claim 12, wherein substantially covering portions of the semiconductive material exposed within the tapered opening with metal silicide material comprises substantially only forming the metal silicide material on the portions of the semiconductive material.

15. A method of forming a microelectronic device, comprising:
vertically recessing a semiconductive material relative to an insulative material horizontally surrounding the semiconductive material to form an initial opening;
forming a dielectric material on portions of the semiconductive material and the insulative material defining the initial opening;
removing portions of the dielectric material on the semiconductive material while substantially maintaining additional portions of the dielectric material on the insulative material;
vertically extending the initial opening into the semiconductive material after removing the portions of the dielectric material to form a tapered opening; and
removing the additional portions of the dielectric material from the insulative material after forming the tapered opening;
substantially covering portions of the semiconductive material exposed within the tapered opening with a metal silicide material;
substantially covering surfaces of the metal silicide material within boundaries of the tapered opening with a metal nitride material; and
forming a conductive material over surfaces of the metal nitride material within the boundaries of the tapered opening.

16. The method of claim 15, wherein forming a dielectric material comprises conformally forming a dielectric oxide material on surfaces of the insulative material and the semiconductive material defining the initial opening.

17. The method of claim 15, wherein vertically extending the initial opening into the semiconductive material comprises removing an additional portion of the semiconductive material underlying the initial opening such that the tapered opening comprises an upper portion having a longitudinal cross-sectional shape substantially the same as that of the initial opening, and a lower portion having a tapered longitudinal cross-sectional shape different than the longitudinal cross-sectional shape of the upper portion.

18. A memory device, comprising:
word lines;
digit lines; and
memory cells coupled to the word lines and the digit lines, each memory cell comprising:
a vertical transistor comprising:
a lower contact structure coupled to one of the digit lines;
a channel structure at least partially vertically overlying the lower contact structure;
at least one gate electrode horizontally neighboring the channel structure;
an upper contact structure partially vertically overlying the channel structure and comprising:
a lower portion vertically extending into the channel structure and exhibiting decreasing horizontal cross-sectional areas at progressively lower vertical elevations within the channel structure; and an upper portion vertically overlying an uppermost boundary of the channel structure and exhibiting a substantially uniform horizontal cross-sectional area across at least a majority of a vertical height thereof; and a capacitor vertically overlying and coupled to the upper portion of the upper contact structure of the vertical transistor.

19. The memory device of claim 18, wherein the lower portion of the upper contact structure has a taper angle within a range of from about 5° to about 15° as measured from a direction perpendicular to an upper surface of the upper contact structure.

20. The memory device of claim 19, wherein the lower portion of the upper contact structure comprises:

a metal silicide material on the channel structure;

a first portion of a metal nitride material on the metal silicide material; and a first portion of a conductive material on the metal nitride material.

21. The memory device of claim 20, wherein the upper portion of the upper contact structure comprises:

a second portion of the metal nitride material directly horizontally adjacent an insulative material horizontally neighboring the channel structure; and a second portion of the conductive material directly horizontally adjacent the second portion of the metal nitride material.

22. An electronic system, comprising:

an input device;

an output device;

a processor device operably coupled to the input device and the output device; and a memory device operably coupled to the processor device, the memory device comprising:

a semiconductive material; and a tapered conductive contact structure vertically extending into the semiconductive material and comprising:

a metal silicide material on the semiconductive material, the metal silicide material substantially horizontally surrounded by the semiconductive material across an entire vertical height of the metal silicide material;

a metal nitride material on the metal silicide material, the metal nitride material substantially horizontally surrounded by the metal silicide material across less than or equal to an entire vertical height of the metal nitride material; and a conductive material on the metal nitride material, the conductive material substantially horizontally surrounded by the metal nitride material across less than or equal to an entire vertical height of the conductive material material, the conductive material comprising:

a first portion having a first width; and a second portion under the first portion and extending into a semiconductive material, the second portion having a tapered profile defining additional widths varying from the first width at an upper boundary of the second portion to a second width less than the first width at a lower boundary of the second portion, a ratio of the second width to the first width being within a range of from about 1:5 to about 1:2.

23. The electronic system of claim 22, wherein portions of each of the metal silicide material, the metal nitride material, and the second portion of the conductive material of the tapered conductive contact structure exhibit a taper angle within a range of from about 5° to about 15° as measured from a direction orthogonal an uppermost surface of the tapered conductive contact structure.

\* \* \* \* \*

UNITED STATES PATENT AND TRADEMARK OFFICE
CERTIFICATE OF CORRECTION

PATENT NO. : 11,393,908 B1
APPLICATION NO. : 17/167853
DATED : July 19, 2022
INVENTOR(S) : Sandeep Ramasamudra Suresha and Terrence B. McDaniel It is certified that error appears in the above-identified patent and that said Letters Patent is hereby corrected as shown below:

In the Specification

| | | |
|---|---|---|
| Column 1, | Line 43, | change "e.g., a transistor)" to --(e.g., a transistor)-- |
| Column 7, | Line 23, | change "titanium oxide (TiO)," to --titanium oxide (TixO),-- |

In the Claims

| | | | |
|---|---|---|---|
| Claim 22, | Column 28, | Line 19, | change "conductive material material," to --conductive material-- |

Signed and Sealed this
Thirteenth Day of December, 2022

Katherine Kelly Vidal
*Director of the United States Patent and Trademark Office*